US012620967B2

(12) United States Patent
Hassanien et al.

(10) Patent No.: US 12,620,967 B2
(45) Date of Patent: May 5, 2026

(54) ENHANCED BULK ACOUSTIC WAVE RESONATOR PERFORMANCE USING METALLIC BRAGG MIRRORS

(71) Applicant: SKYWORKS SOLUTIONS, INC., Irvine, CA (US)

(72) Inventors: Ahmed E. Hassanien, Savoy, IL (US); Scott J. Smith, Hollis, NH (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 106 days.

(21) Appl. No.: 18/599,678

(22) Filed: Mar. 8, 2024

(65) Prior Publication Data

US 2024/0313740 A1      Sep. 19, 2024

Related U.S. Application Data

(60) Provisional application No. 63/452,808, filed on Mar. 17, 2023.

(51) Int. Cl.
H03H 9/17        (2006.01)
H03H 9/56        (2006.01)

(52) U.S. Cl.
CPC ............ H03H 9/175 (2013.01); H03H 9/568 (2013.01)

(58) Field of Classification Search
CPC .... H03H 9/175; H03H 9/02118; H03H 9/173; H03H 9/568; H03H 9/131; H03H 9/02015; H03H 9/02157; H03H 9/589; H03H 9/605; H03H 3/04; H03H 9/174; H03H 3/02; H03H 9/132; H03H 9/205; H03H 9/02102; H03H 9/17; H03H 9/54; H03H 2003/0428; H03H 9/13; H03H 2003/021; H03H 2009/02165; H03H 9/0207; H03H 9/02078; H03H 9/0211; H03H 9/02259; H10N 30/87; H10N 30/883

See application file for complete search history.

(56) References Cited

U.S. PATENT DOCUMENTS

| | | | |
|---|---|---|---|
| 2014/0184358 A1 | 7/2014 | Maurer | |
| 2019/0305755 A1 | 10/2019 | Kreuzer | |
| 2021/0273625 A1 | 9/2021 | Hill | |
| 2022/0131521 A1* | 4/2022 | Yusuf ...................... H03H 9/13 | |
| 2022/0140806 A1* | 5/2022 | Burak .................. H03H 9/0211 | |
| | | | 333/187 |
| 2022/0149806 A1 | 5/2022 | Lee et al. | |
| 2022/0286108 A1* | 9/2022 | Hill .................... H03H 9/02015 | |
| 2025/0219615 A1 | 7/2025 | Abbott et al. | |

OTHER PUBLICATIONS

Enlund et al., "Solidly mounted thin film electro-acoustic resonator utilizing a conductive Bragg reflector," ScienceDirect, Sensors and Acuators A 141 (2008), pp. 598-602.

* cited by examiner

*Primary Examiner* — Lincoln D Donovan
*Assistant Examiner* — Tyler J Pereny
(74) *Attorney, Agent, or Firm* — Lando & Anastasi, LLP

(57)        ABSTRACT

Aspects and embodiments include a bulk acoustic wave resonator comprising a layer of piezoelectric material, an upper electrode disposed on top of the layer of piezoelectric material, the upper electrode including a metallic Bragg mirror having alternating layers of a first metal and a second metal, and a lower electrode disposed on a bottom of the layer of piezoelectric material, the lower electrode including a metallic Bragg mirror having alternating layers of a third metal and a fourth metal.

20 Claims, 30 Drawing Sheets

$$f_s = \frac{v}{2d}$$

$d = 890\,nm$ $f_s = 5.9\,\text{GHz}$ $k_t^2 = 7.2\ \%$

FILM THICKNESS (nm)

$f_s = 5.9$ GHz
$k_t^2 = 2.37\%$

FREQUENCY (GHz)

ADMITTANCE (dB)

$f_s = 5.9\,\text{GHz}$
$k_t^2 = 2.37\%$

FREQUENCY (GHz)

ADMITTANCE (dB)

$f_s = 5.9$ GHz
$k_t^2 = 2.37\%$

FREQUENCY (GHz)

ADMITTANCE (dB)

ENHANCED BULK ACOUSTIC WAVE RESONATOR PERFORMANCE USING METALLIC BRAGG MIRRORS

CROSS-REFERENCE TO RELATED APPLICATIONS

This application claims priority under 35 U.S.C. § 119(e) to U.S. Provisional Patent Application Ser. No. 63/452,808, titled "ENHANCED BULK ACOUSTIC WAVE RESONATOR PERFORMANCE USING METALLIC BRAGG MIRRORS," filed Mar. 17, 2023, the subject matter which being incorporated herein by reference for all purposes.

BACKGROUND

Technical Field

Embodiments of this disclosure relate to bulk acoustic wave resonators and to acoustic wave filters, electronic modules, and electronic devices including same.

Description of Related Technology

Acoustic wave filters can filter radio frequency signals. An acoustic wave filter can include a plurality of acoustic wave resonators arranged to filter a radio frequency signal. The resonators can be arranged as a ladder circuit. Example acoustic wave resonators include surface acoustic wave (SAW) resonators and bulk acoustic wave (BAW) resonators. A film bulk acoustic wave resonator is an example of a BAW resonator. A solidly mounted resonator (SMR) is another example of a BAW resonator.

Acoustic wave filters can be implemented in radio frequency electronic systems. For instance, filters in a radio frequency front end of a mobile phone can include acoustic wave filters. Two acoustic wave filters can be arranged as a duplexer.

SUMMARY

In accordance with one aspect, there is provided a bulk acoustic wave resonator. The bulk acoustic wave resonator comprises a layer of piezoelectric material, an upper electrode disposed on top of the layer of piezoelectric material, the upper electrode including a metallic Bragg mirror having alternating layers of a first metal and a second metal, and a lower electrode disposed on a bottom of the layer of piezoelectric material, the lower electrode including a metallic Bragg mirror having alternating layers of a third metal and a fourth metal.

In some embodiments, the upper electrode includes multiple pairs of the alternating layers of the first metal and the second metal.

In some embodiments, the first metal is the same as the third metal and the second metal is the same as the fourth metal.

In some embodiments, the first metal has a different acoustic impedance than an acoustic impedance of the second metal.

In some embodiments, the first metal has a different electrical conductivity than an electrical conductivity of the second metal.

In some embodiments, the first metal is titanium and the second metal is ruthenium.

In some embodiments, each of the layers of the first and second metals has a same thickness.

In some embodiments, each of the layers of the first and second metals has a thickness of $\lambda/4$, $\lambda$ being a wavelength of a main acoustic wave generated in the bulk acoustic wave resonator.

In some embodiments, a metal layer of the upper electrode closest to the layer of piezoelectric material has a different thickness than other layers of that same metal.

In some embodiments, a metal layer of the lower electrode closest to the layer of piezoelectric material has a different thickness than other layers of that same metal.

In some embodiments, the metal layer of the upper electrode closest to the layer of piezoelectric material is formed of the first metal and has a lower acoustic impedance than the second metal.

In some embodiments, the metal layer of the upper electrode closest to the layer of piezoelectric material is formed of the first metal and has a higher acoustic impedance than the second metal.

In some embodiments, the bulk acoustic wave resonator is configured as a film bulk acoustic wave resonator.

In some embodiments, the bulk acoustic wave resonator is configured as a solidly mounted resonator.

In some embodiments, the bulk acoustic wave resonator further comprises a layer of dielectric material disposed between the layer of piezoelectric material and at least one of the upper electrode or the lower electrode.

In some embodiments, the bulk acoustic wave resonator further comprises a layer of dielectric material disposed between the layer of piezoelectric material and the upper electrode and a layer of dielectric material disposed between the layer of piezoelectric material and the lower electrode.

In some embodiments, the layer of dielectric material is a temperature compensating layer.

In some embodiments, a metal layer of the upper electrode closest to the layer of piezoelectric material is formed of a same metal as a metal layer of the lower electrode closest to the layer of piezoelectric material.

In some embodiments, a metal layer of the upper electrode closest to the layer of piezoelectric material is formed of a different metal than a metal layer of the lower electrode closest to the layer of piezoelectric material.

In some embodiments, the layers of the first metal have different thicknesses than the layers of the second metal.

In some embodiments, the bulk acoustic wave resonator is included in an acoustic wave filter.

In some embodiments, the acoustic wave filter is included in an electronics module.

In some embodiments, the electronics module is included in an electronic device.

BRIEF DESCRIPTION OF THE DRAWINGS

Embodiments of this disclosure will now be described, by way of non-limiting example, with reference to the accompanying drawings.

DETAILED DESCRIPTION

Figure 1:
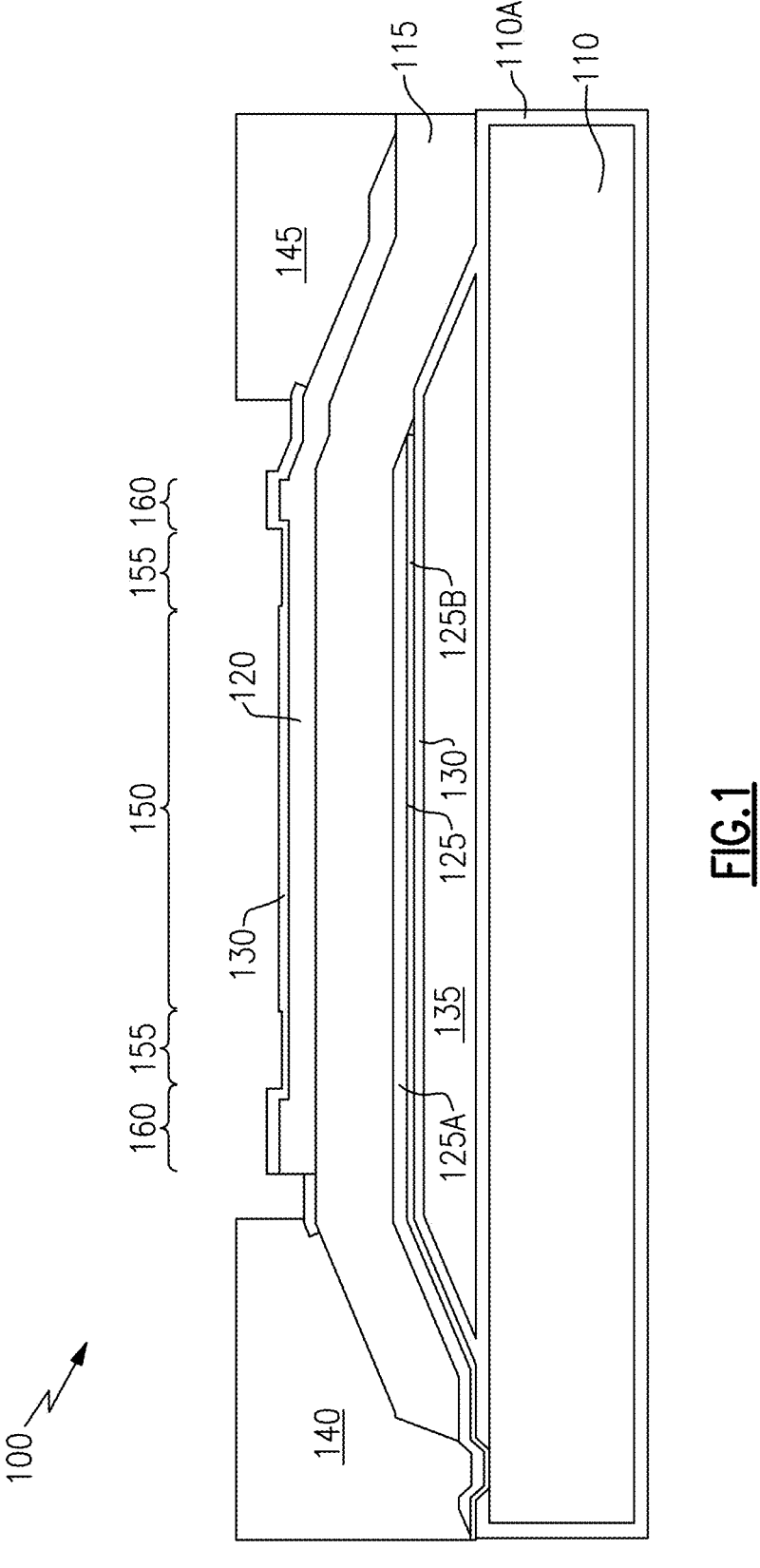
FIG. 1 is a cross-sectional view of an example of film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A film bulk acoustic wave resonator exhibits a frequency response to applied signals with a resonance peak determined, in part, by a thickness of the film of piezoelectric material. Ideally, the only acoustic wave that would be generated in a film bulk acoustic wave resonator is a main acoustic wave that would travel through the film of piezoelectric material in a direction perpendicular to layers of conducting material forming the top and bottom electrodes. The piezoelectric material of a film bulk acoustic wave resonator, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the film bulk acoustic wave resonator from what is expected or from what is intended and are generally considered undesirable.

FIG. 1 is cross-sectional view of an example of a film bulk acoustic wave resonator, indicated generally at 100. The film bulk acoustic wave resonator 100 is disposed on a substrate 110, for example, a silicon substrate that may include a dielectric surface layer 110A of, for example, silicon dioxide. The film bulk acoustic wave resonator 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The film bulk acoustic wave resonator 100 may include a central region 150 including a main active domain in the layer or film of piezoelectric material 115 in which a main acoustic wave is excited during operation. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The material layer 130 in the recessed frame region(s) 155 is typically etched during manufacturing to achieve a desired difference in acoustic velocity between the central region 150 and the recessed frame region(s) 155. Accordingly, the dielectric material layer 130 initially deposited in both the central region 150 and recessed frame region(s) 155 is deposited with a sufficient thickness that allows for etching of sufficient dielectric material in the recessed frame region(s) 155 to achieve a desired difference in thickness of the dielectric material layer 130 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm.

The recessed frame region(s) 155 and the raised frame region(s) 160 may contribute to dissipation or scattering of transverse acoustic waves generated in the film bulk acoustic wave resonator 100 during operation and/or may reflect transverse waves propagating outside of the recessed frame region(s) 155 and the raised frame region(s) 160 and prevent these transverse acoustic waves from entering the central region and inducing spurious signals in the main active domain region of the film bulk acoustic wave resonator. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Another form of BAW resonator is a solidly mounted resonator (SMR). An example of an SMR is illustrated generally at 200 in FIG. 2. As illustrated, the SMR 200 includes a piezoelectric layer 205, an upper electrode 210 on the piezoelectric layer 205, and a lower electrode 215 on a lower surface of the piezoelectric layer 205. The piezoelectric layer 205 can be an aluminum nitride layer. In other instances, the piezoelectric layer 205 can be any other suitable piezoelectric layer. The lower electrode 215 can be grounded in certain instances. In some other instances, the lower electrode 215 can be floating. Bragg reflectors 220 are disposed between the lower electrode 215 and a semiconductor substrate 225. The semiconductor substrate 225 can be a silicon substrate. Any suitable Bragg reflectors can be implemented. For example, the Bragg reflectors can be $SiO_2$/W.

It should be appreciated that the BAW resonators illustrated in the figures are illustrated in a highly simplified form. The relative dimensions of the different features are not shown to scale. Further, typical BAW resonators may include additional features or layers not illustrated.

Moving towards higher frequencies beyond 5 GHZ, film bulk acoustic wave resonator piezoelectric layers and electrodes become very thin resulting in quality factor deterioration. One example is Band 47 targeting Vehicle-to-Everything (V2X) applications where the quality factor is less than 400 and the piezoelectric thickness is out of reliable fabrication ranges. This causes insertion loss deterioration, limited power handling capabilities, and reduced yield.

Aspects and embodiments disclosed herein involve the use of multiple layers of metals for the electrodes of a BAW resonator instead of a single metal layer. The multilayer stack of metals forms a Bragg reflector (mirror) that confines the acoustic energy to the piezoelectric material layer and first few layers of the reflector. Adding more layers increases the electrode conductivity while maintaining the piezoelectric material layer thickness. Metal layers forming the mirror should have a large mismatch in acoustic impedance and should be sized to yield high reflection at the frequency of operation of the resonator. Metal layers formed of metals such as ruthenium and titanium that are already available in many BAW resonator fabrication processes can be used to build the metallic electrode/mirror. The metallic mirror results in better resonator quality factor which means better filter insertion loss. Moreover, the metallic mirror provides a thermal path which improves the power handling and ruggedness of BAW filters.

As noted above the resonant frequency of a BAW resonator is dependent on the thickness of the piezoelectric material layer used in the resonator. For an ideal layer of piezoelectric material without electrodes, the resonant frequency $f_s$ may be determined by the equation:

$$f_s = \frac{v}{2d} \tag{1}$$

where v is the speed of sound through the layer of piezoelectric material and d is the thickness of the layer of piezoelectric material. As one example, illustrated in FIG. 3, a layer of AlN with a thickness of 890 nm exhibits a resonant frequency of 5.9 GHZ.

Figure 4A:
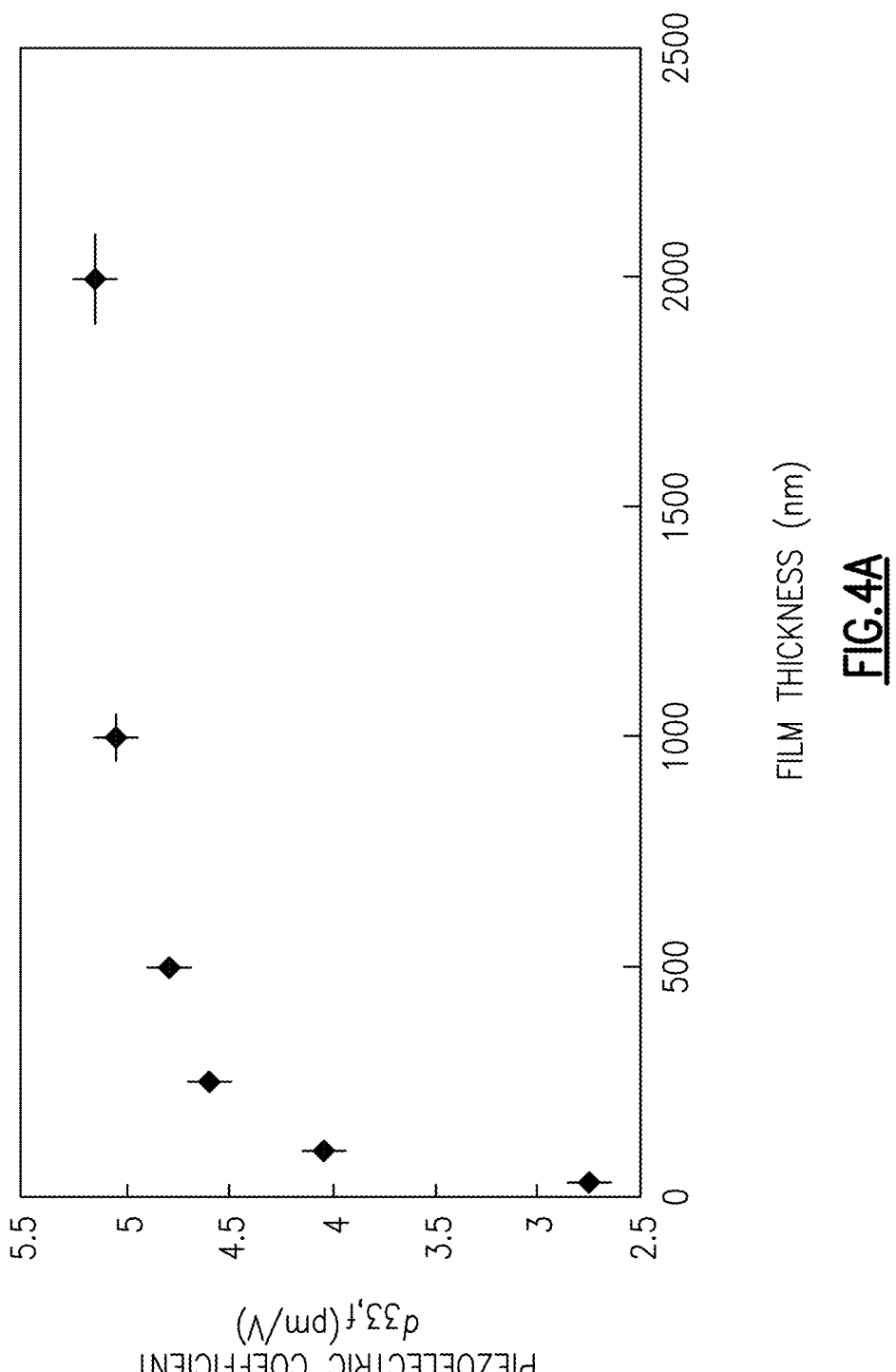
FIG. 4A is a chart of piezoelectric coefficient as a function of thickness of a layer of piezoelectric material.
Figure 4B:
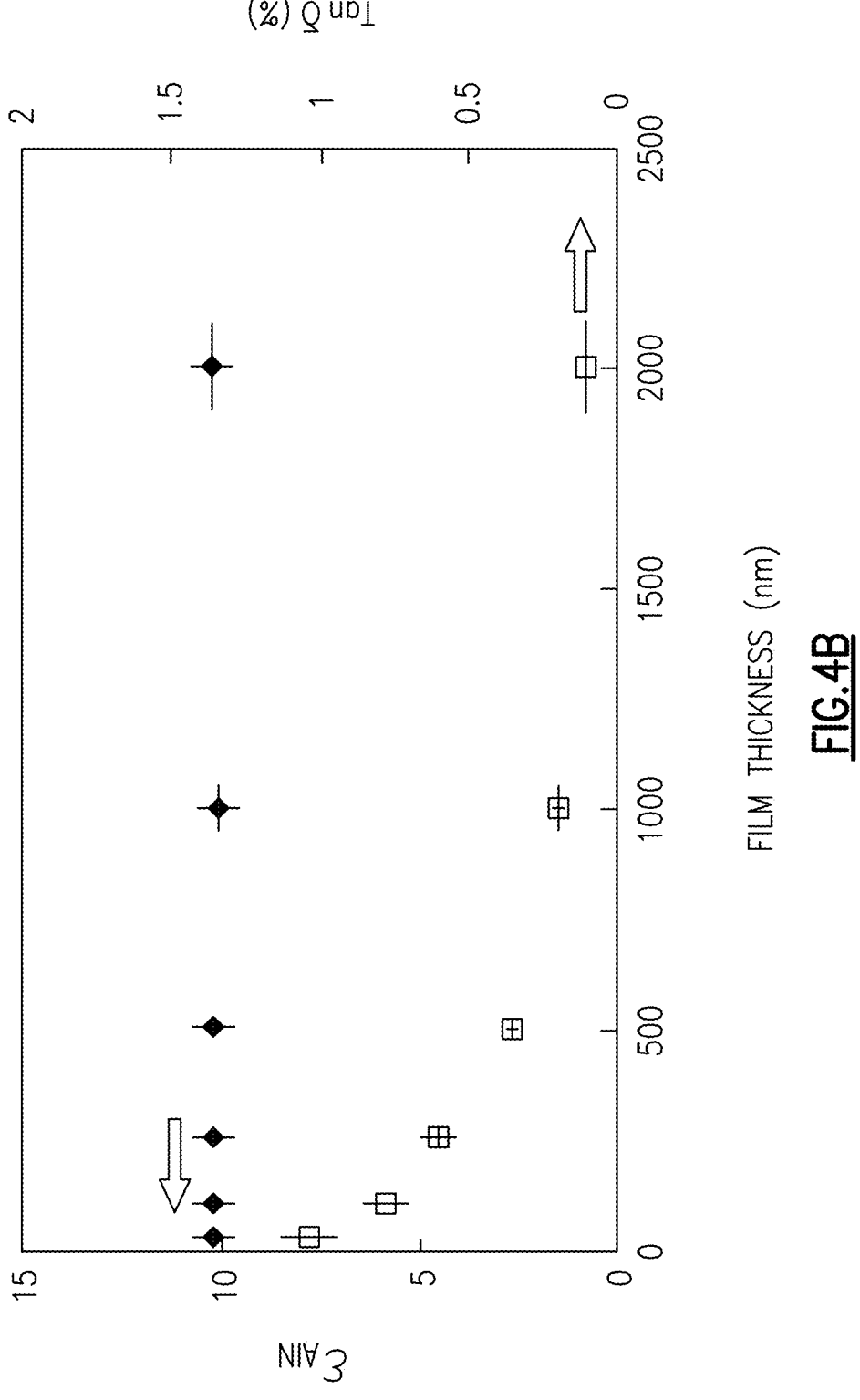
FIG. 4B is a chart of loss tangent as a function of thickness of a layer of piezoelectric material.

As the film of piezoelectric material, for example, AlN in a BAW resonator becomes thinner, both the piezoelectric coefficient and the loss tangent become worse, as shown in the charts of FIGS. 4A and 4B, reproduced from Yan Liu, et al., "Materials, Design, and Characteristics of Bulk Acoustic Wave Resonator: A Review", Micromachines, 2020, where the loss tangent is represented by the square data point indicators.

Figure 3:
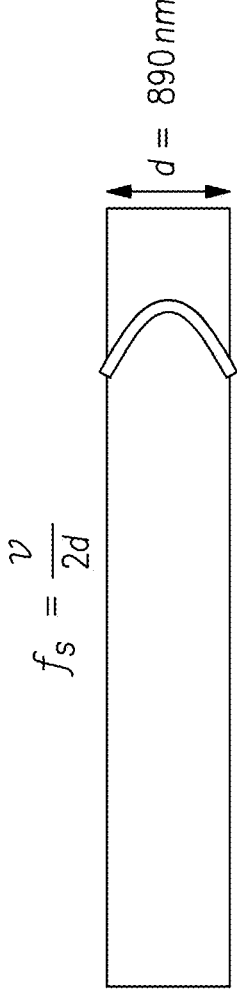
FIG. 3 illustrates a piezoelectric material layer that may be utilized in a bulk acoustic wave (BAW) resonator and an admittance curve of the piezoelectric material layer.
Figure 3:
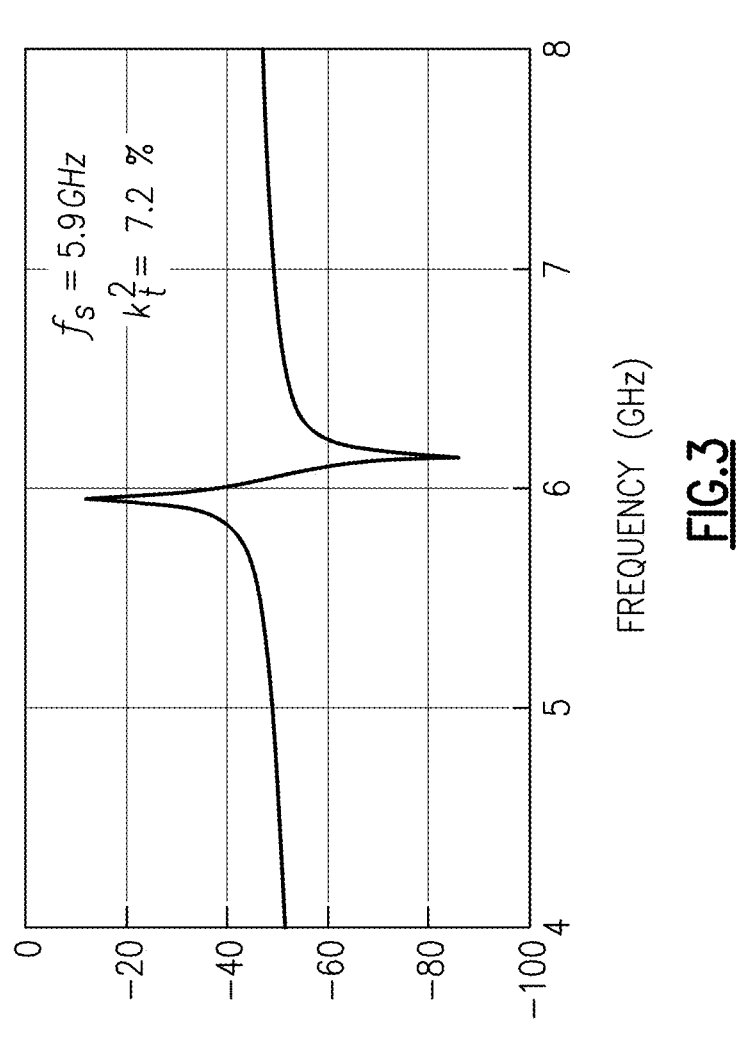
Figure 5:
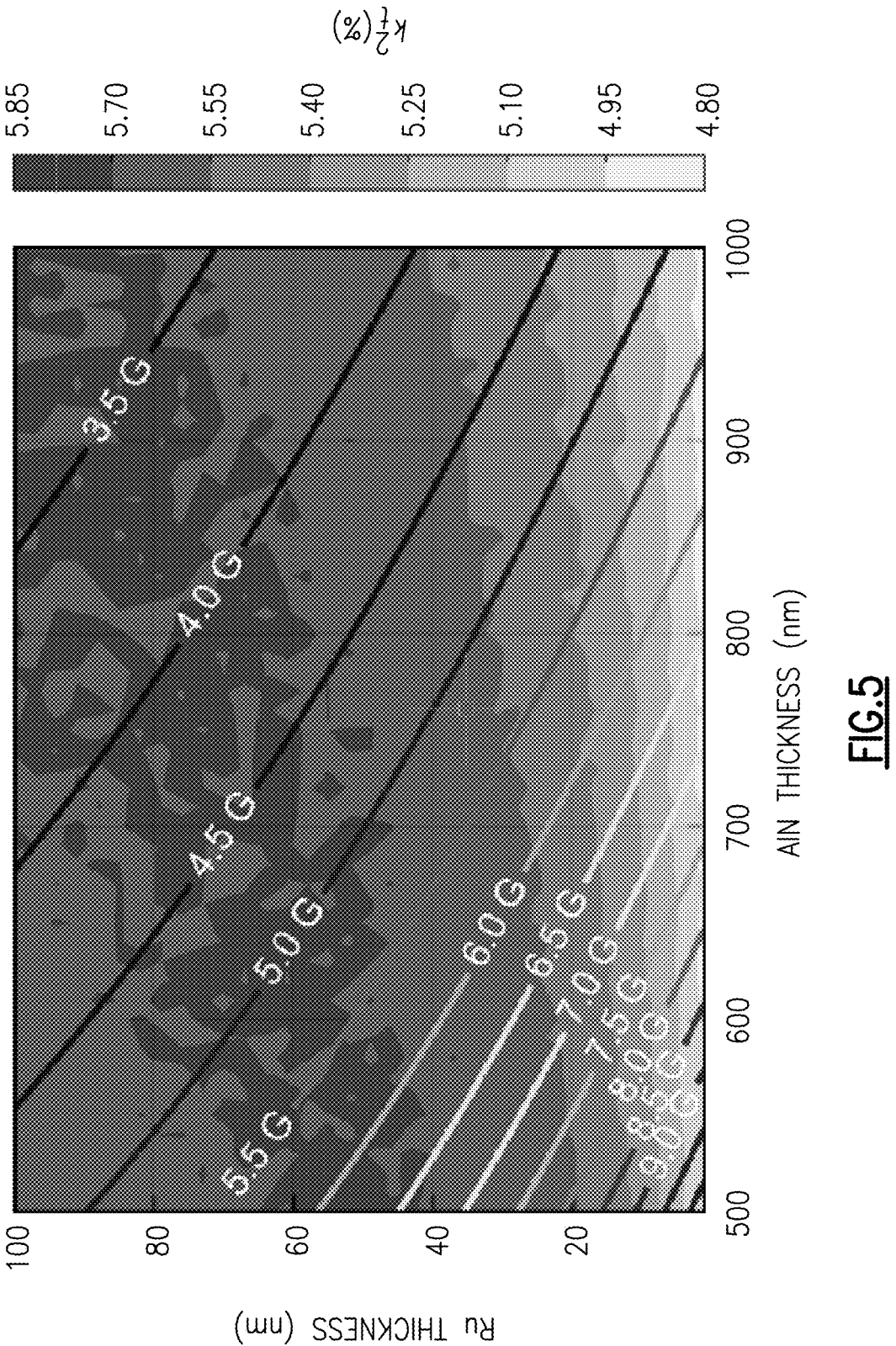
FIG. 5 is a chart of resonant frequency and electromechanical coupling coefficient as a function of piezoelectric material layer and electrode thicknesses in a BAW resonator.
Figure 6:
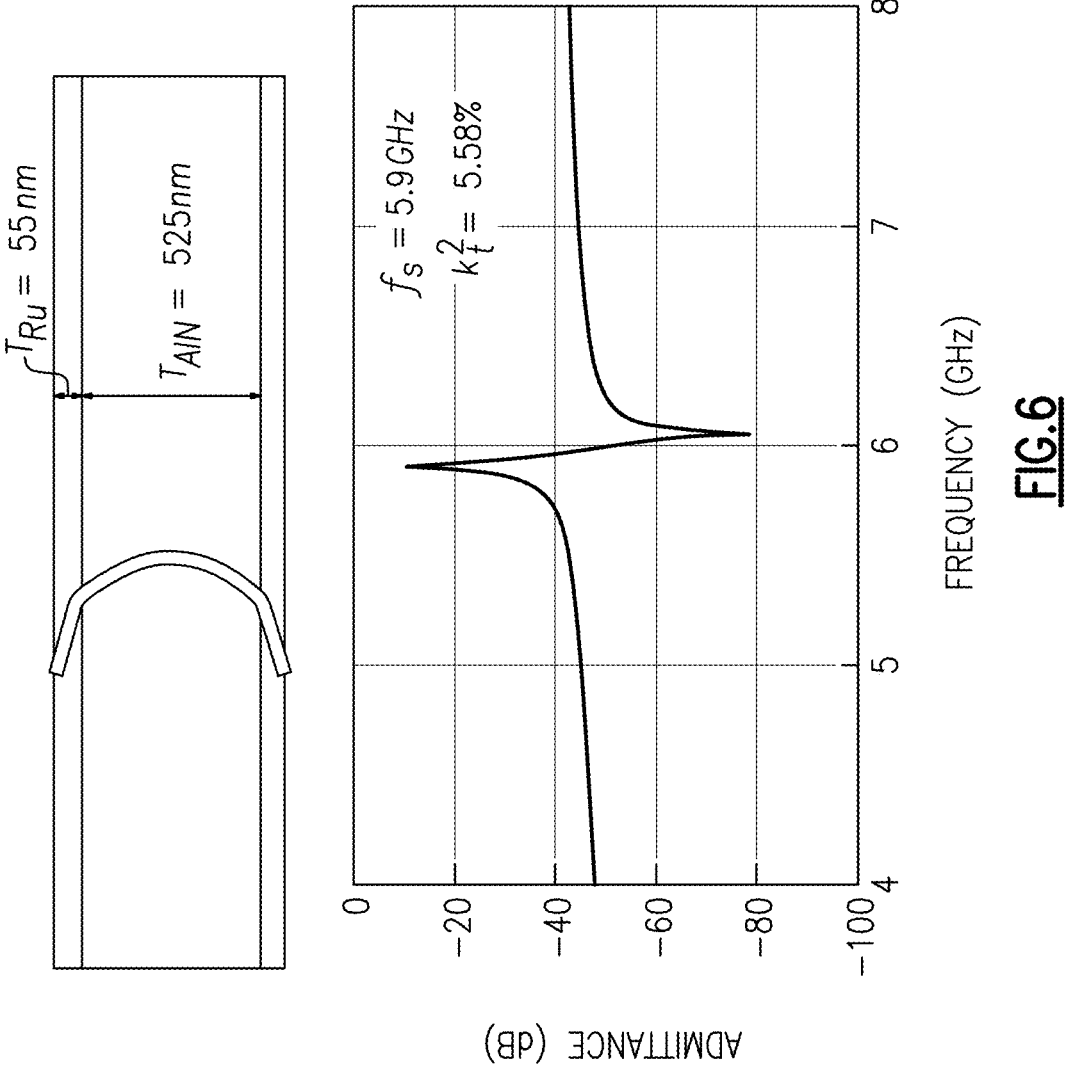
FIG. 6 illustrates a layer of AlN with upper and lower electrodes formed of Ru and a simulated admittance curve for a BAW resonator including a resonance structure including the layer of AlN with the upper and lower electrodes formed of Ru.

When electrodes are disposed on a layer of piezoelectric material, this adds mass which results in a reduction in resonant frequency as compared to the layer of piezoelectric material without electrodes. FIG. 5 is a chart showing resonant frequency of a layer of AlN as a function of thickness of the layer of AlN and thickness of Ru electrodes disposed on the upper and lower surfaces of the layer of AlN. The chart in FIG. 5 also shows that the electromechanical coupling coefficient $k_t^2$ increases with increased electrode thickness and decreased AlN layer thickness. In one example, shown in FIG. 6, when Ru electrodes having thicknesses of 55 nm are disposed on a layer of AlN, the thickness of the AlN must be reduced from 890 nm as illustrated in the example of FIG. 3 to 525 nm to achieve the same resonant frequency of 5.9 GHZ.

Figure 7:
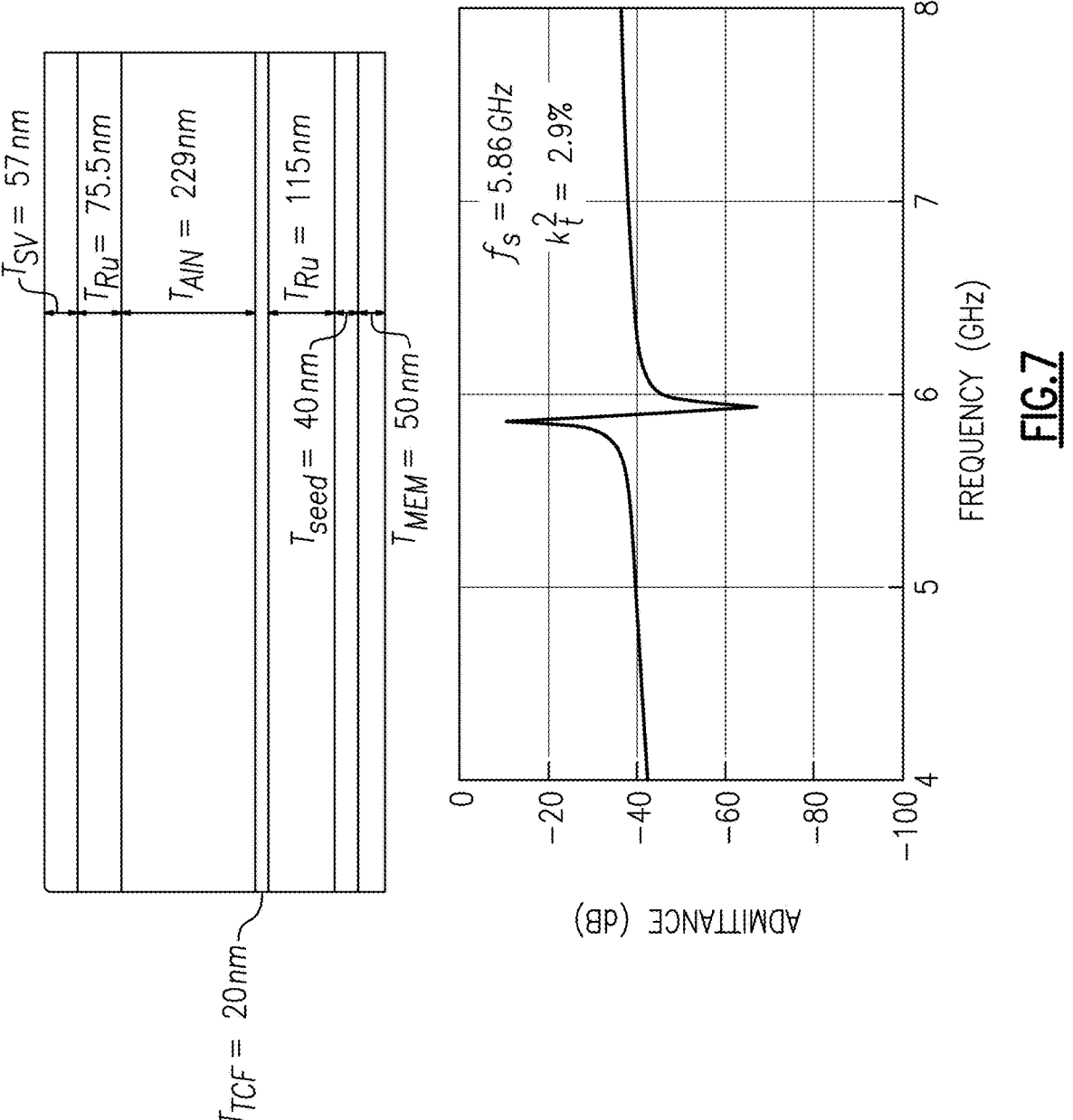
FIG. 7 illustrates a layer of AlN with upper and lower electrodes formed of Ru as well as other material layers that may be utilized in a BAW resonator and a simulated admittance curve for a BAW resonator including the illustrated structure.

In some BAW designs, the piezoelectric film layer may not only have electrodes disposed on either side, but may also have, as illustrated in FIG. 7 a protective layer (layer SV, formed of silicon dioxide), a temperature compensation layer (layer TCF, formed of silicon dioxide), a seed layer formed of, for example, AlN, and a lower protective layer (layer MEM, formed of silicon dioxide). These additional layers result in the AlN layer having to be even thinner, for example, about 229 nm to achieve a similar resonant frequency as the free layer of AlN illustrated in FIG. 3.

Figure 8:
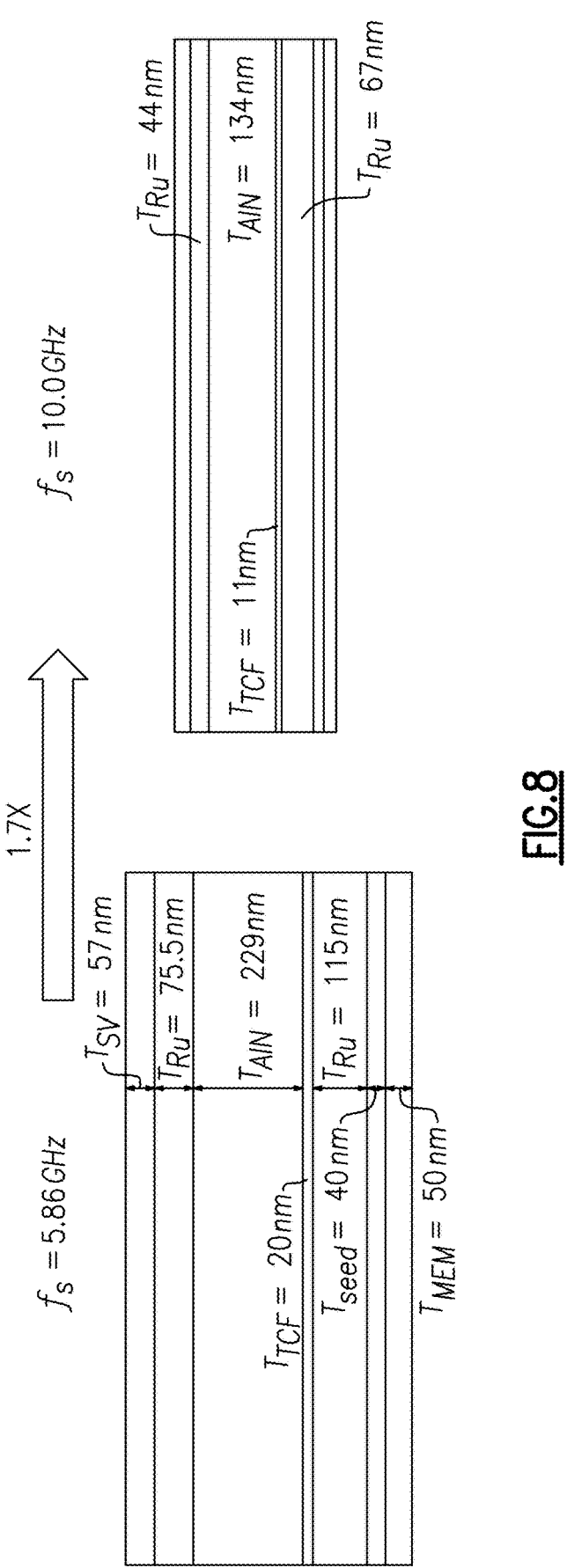
FIG. 8 illustrates how a resonance structure for a BAW resonator as illustrated in FIG. 7 may be thinned to increase its resonance frequency.

Due to the dependence of the resonant frequency of a BAW resonator on the thickness of the piezoelectric material layer and other layers disposed on the piezoelectric material layer, to increase operating frequency, one may make the stack of material layers thinner. For example, if one were to modify the material layer stack of FIG. 7 to exhibit a resonant frequency of 10 GHZ instead of 5.86 GHZ, one could thin the resonating material layer stack by a factor of 10/5.86=1.7 times. This is illustrated in FIG. 8. The resulting thinned resonating material layer stack would include an AlN layer only 134 nm thick. It would be difficult to repeatably manufacture resonators with such a thin AlN layer and such a thin AlN layer may be subject to breakdown if too high a voltage were applied across the electrodes.

In some embodiments, one may achieve a high resonance (and anti-resonance) frequency in a BAW resonator while keeping the layer of piezoelectric material reasonably thick by utilizing a metallic Bragg mirror structure in place of conventional electrodes for exciting acoustic waves in the piezoelectric material layer. Bragg mirror electrode structures as disclosed herein may be formed from alternating layers of low acoustic impedance and high acoustic impedance metal layers. The metallic Bragg mirror electrode structure may result in an electrode structure that is thickened relative to conventional electrodes for exciting acoustic waves in a BAW piezoelectric material layer and that exhibit increased confinement of mechanical energy within the piezoelectric material layer. The bandwidth and effectiveness of reflection of acoustic energy by the metallic Bragg mirror electrode may be a function of the mismatch in acoustic impedance between the different metals used as well as the number of pairs of high impedance and low impedance metals. The metals used for the Bragg mirror electrode structure may be selected based not only on their mismatch in acoustic impedance but also based on their electrical conductivity, with higher conductivity materials being preferred.

Figure 9A:
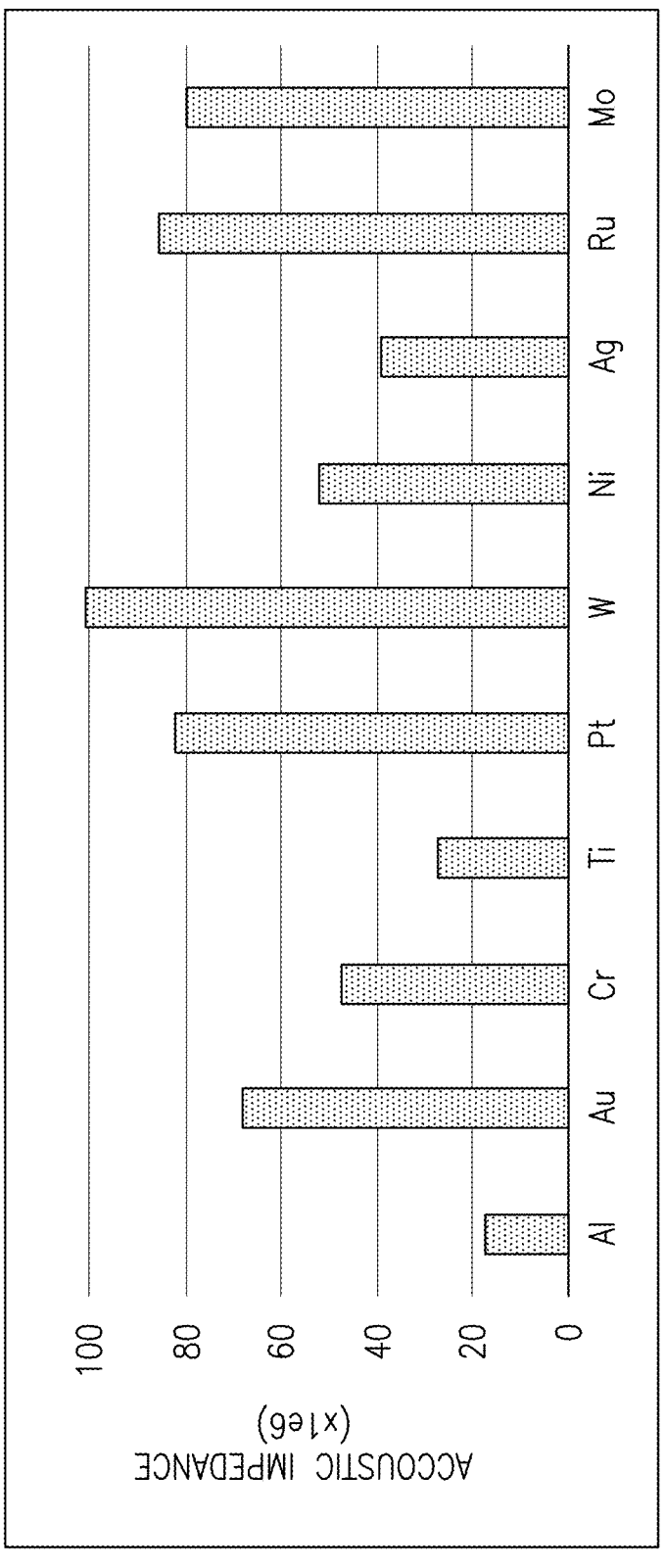
FIG. 9A is a chart of acoustic impedance of selected metals.
Figure 9B:
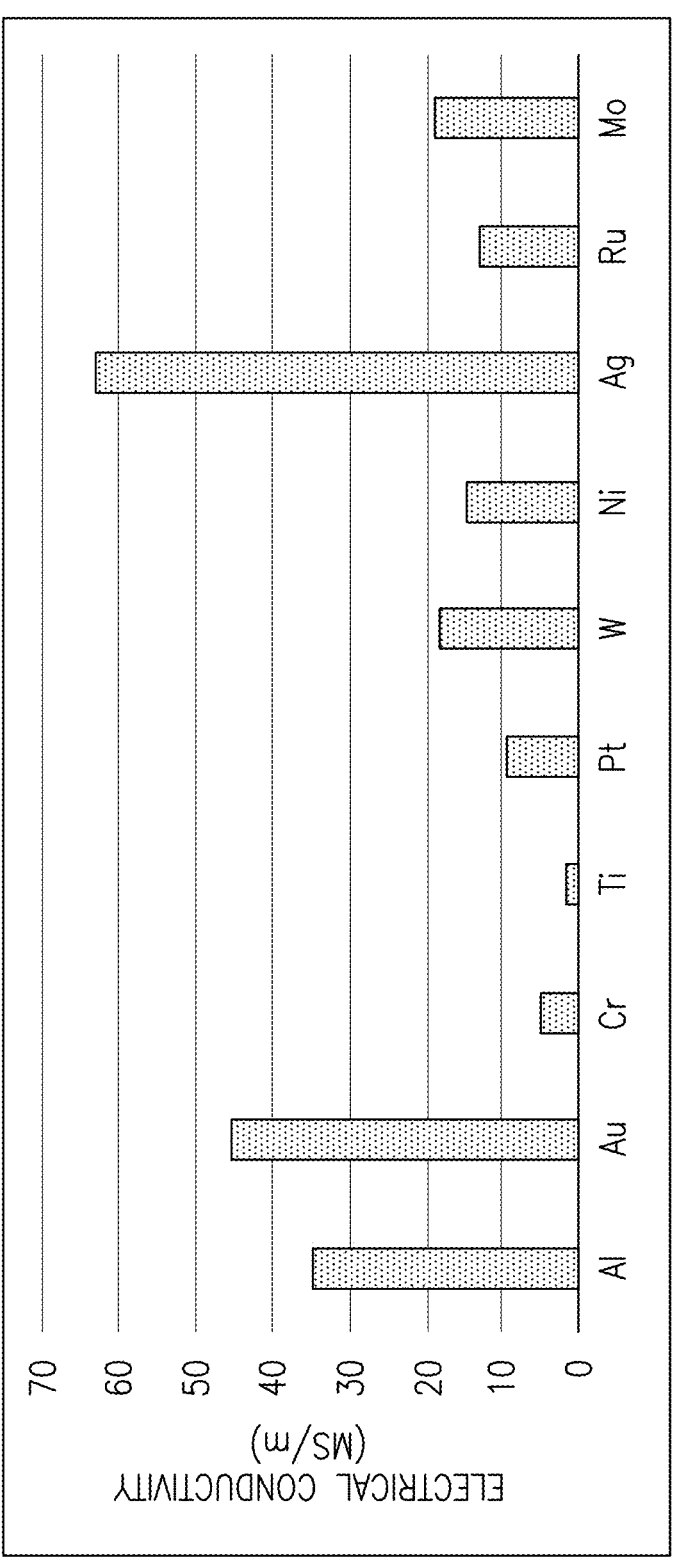
FIG. 9B is a chart of electrical conductivity of selected metals.

FIG. 9A illustrates relative acoustic impedances for a number of metals that may be found in many semiconductor fabrication processes and FIG. 9B illustrates the relative electrical conductivities of these metals. As can be seen from these figures, Al and W have the highest mismatch in acoustic impedance among the metals being compared. Al also has a relatively high conductivity. Al, however, has a lower melting temperature than many others of the metals being compared and might not be able to survive high temperatures utilized in some BAW manufacturing process steps with a desired reliability. W is a relatively heavy metal and could possibly decrease the resonant frequency of a BAW resonator to an undesired degree if used in a piezoelectric material layer Bragg mirror electrode structure. Among the other metals compared, Ru and Ti have a large enough mismatch in acoustic impedance and high enough conductivity to form an acceptable Bragg mirror electrode structure.

Figure 10:
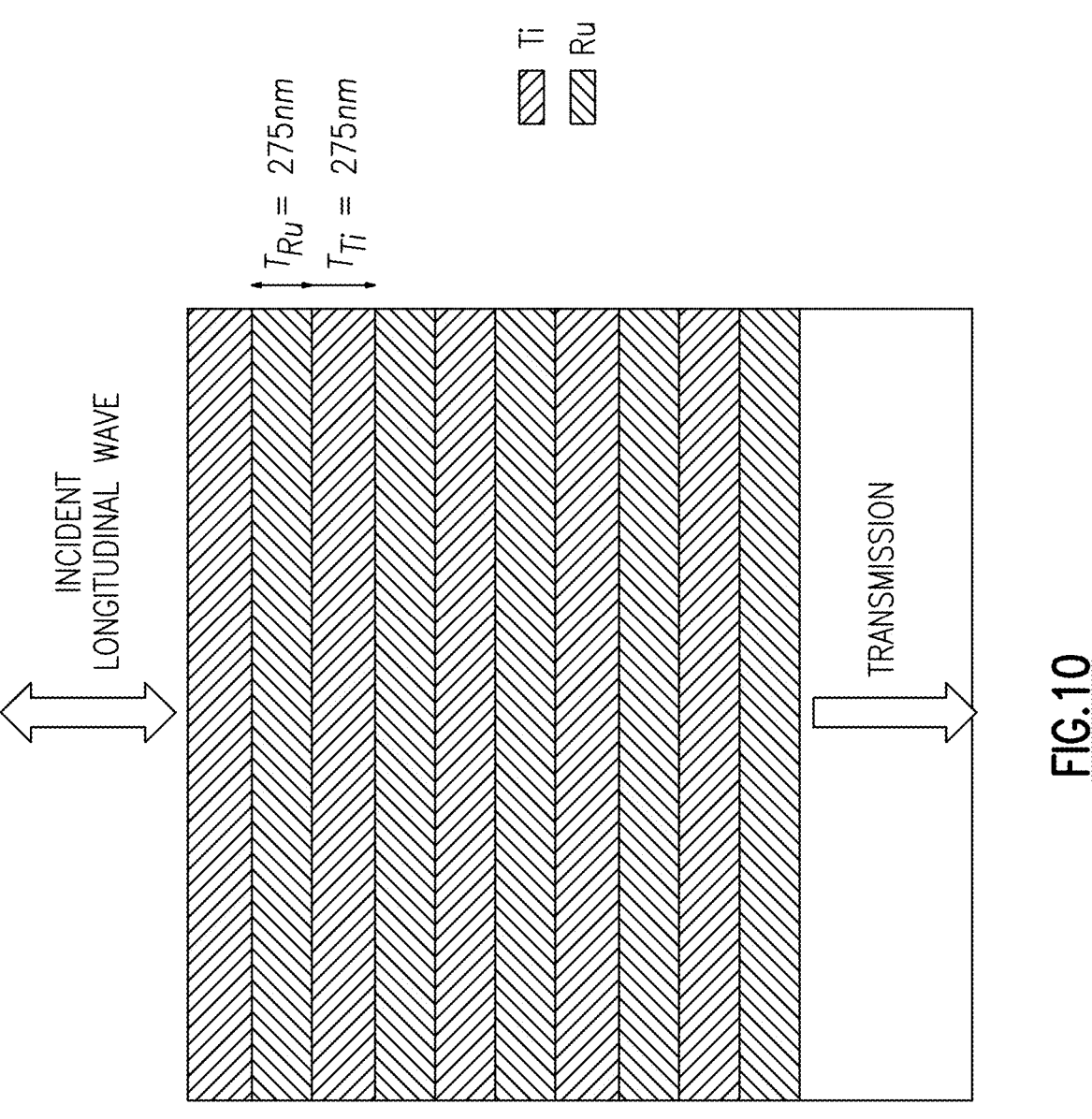
FIG. 10 illustrates a Bragg mirror formed of alternating layer of different metals that may be used as an electrode for inducing acoustic waves in a piezoelectric film in a BAW resonator.
Figure 11A:
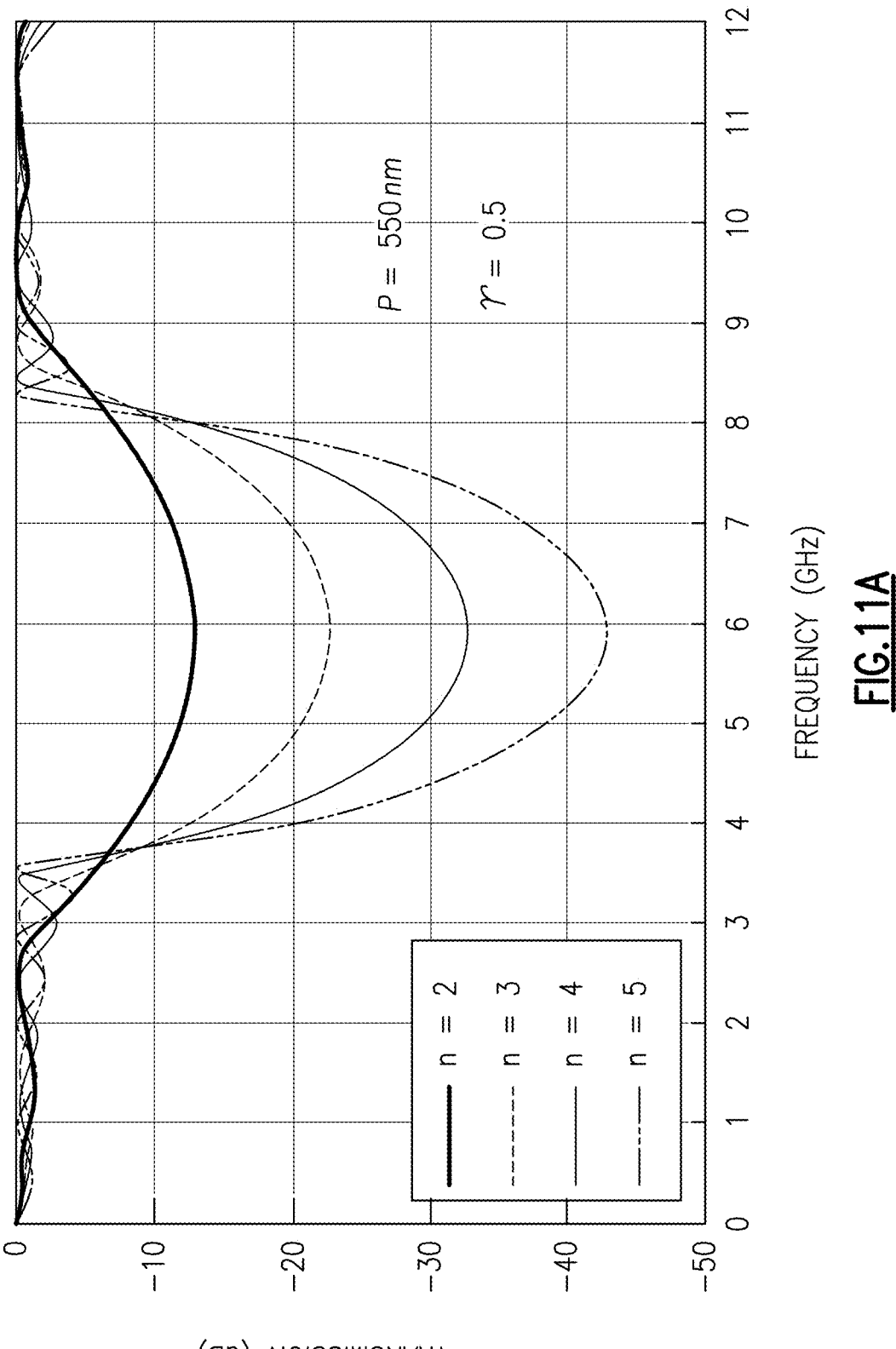
FIG. 11A illustrates acoustic transmission through a metallic Bragg mirror as a function of number of metal layer pairs.
Figure 11B:
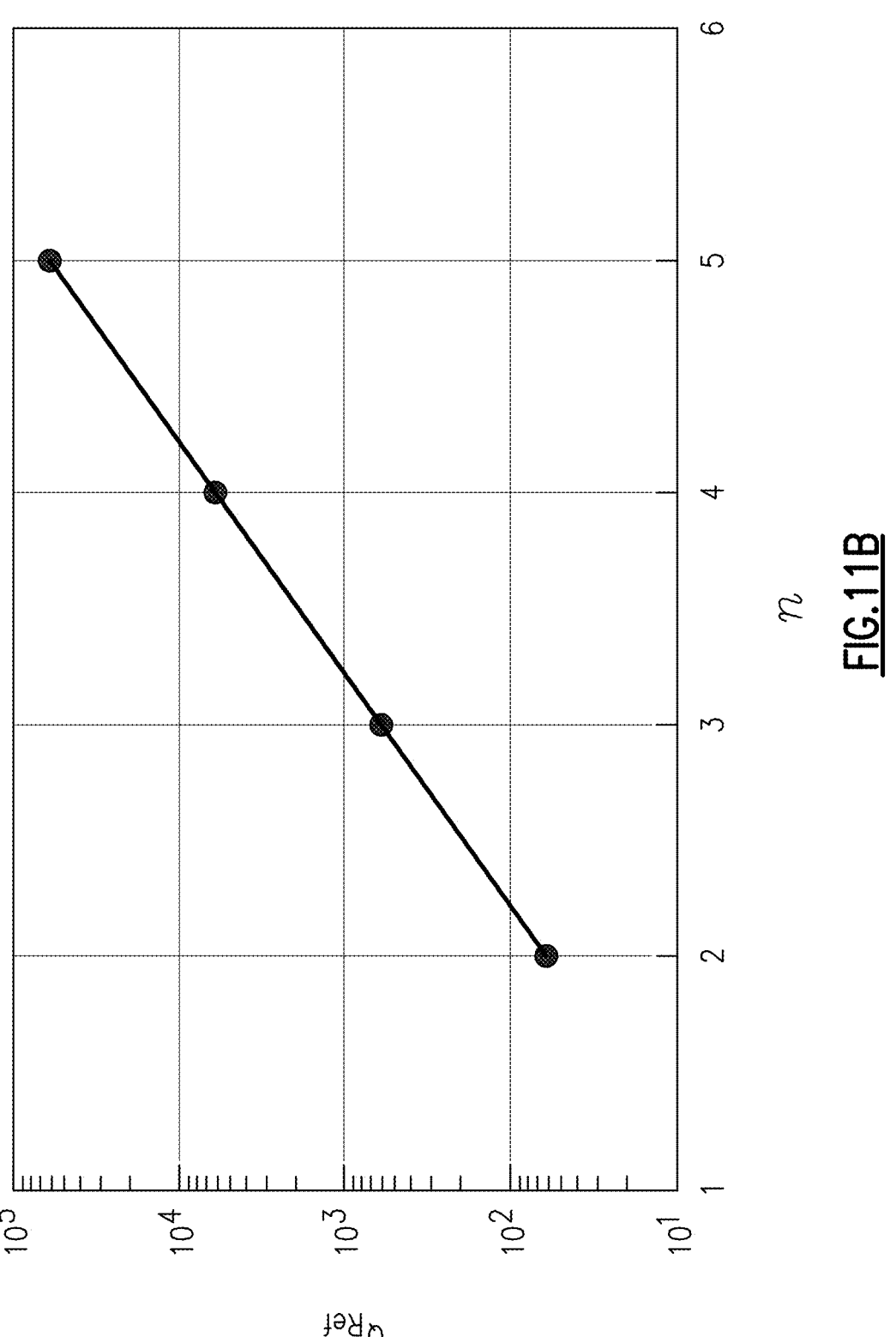
FIG. 11B illustrates quality factor of a BAW resonator including metallic Bragg mirror electrodes for inducing acoustic waves in a piezoelectric film in the BAW resonator as a function of number of metal layer pairs.

One example of a Bragg mirror electrode structure that could be utilized for a BAW resonator with a resonant frequency of 5.9 GHZ is illustrated in FIG. 10. The Bragg mirror electrode structure of FIG. 10 includes alternating layers of Ru and Ti, each with a thickness ($T_{Ru}$, $T_{Ti}$) of 275 nm which is ¼ of the wavelength of an acoustic wave with a frequency of 5.9 GHz passing through the Bragg mirror structure. As illustrated in FIG. 11A, as the number n of pairs of layers with a pair thickness P of $T_{Ru}+T_{Ti}=550$ nm and a layer thickness ratio r of $T_{Ti}/P=0.5$ increases the amount of acoustic energy that is able to be transmitted through the Bragg mirror structure decreases. This decrease in acoustic energy transmittal, or increase in acoustic energy reflectance, with increasing number of metal layer pairs results in a logarithmic increase in quality factor Q of a BAW resonator using such a Bragg mirror electrode structure, as illustrated in FIG. 11B.

In some embodiments, a different number of pairs of metal layers may be utilized for the upper vs. the lower electrode for exciting and reflecting an acoustic wave in a piezoelectric material layer in a BAW resonator. For example, because the top surface of the BAW may be exposed to air, a lesser number of pairs of metal layers could be utilized as the wave may be completely reflected at the metal/air interface. This could save some cost. On the bottom side of the BAW piezoelectric material layer, more pairs of metal layers may be utilized if the BAW device will be mounted on a substrate, for example, as in an SMR. In an SMR, the metallic mirror may be relied on to reflect the acoustic waves. On the other hand, if the BAW piezoelectric material layer is suspended, for example, as in a film bulk acoustic wave resonator, the wave may be reflected completely at the air interface and a lesser number of pairs of metal layers may be utilized.

Figure 12A:
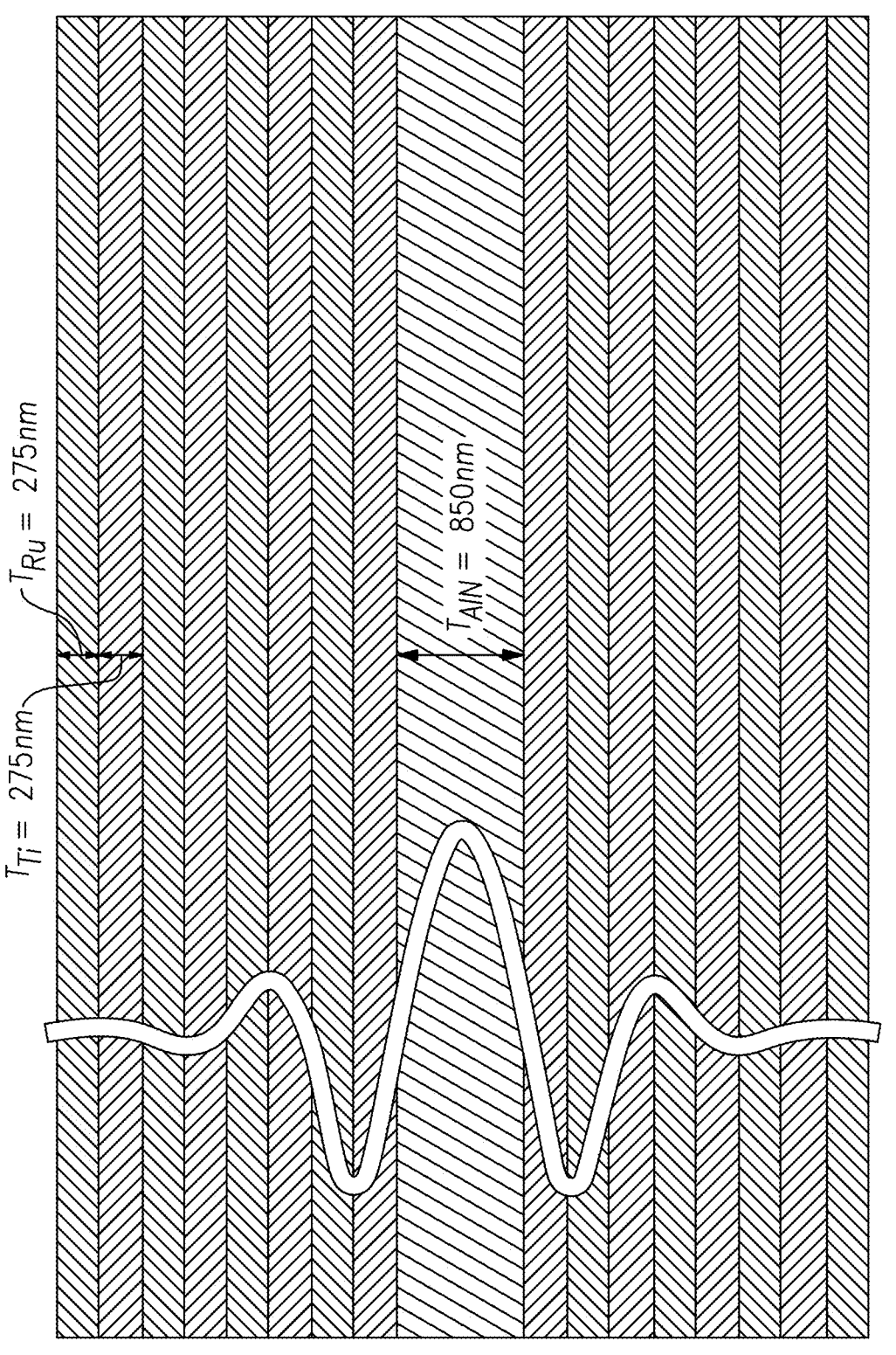
FIG. 12A illustrates a resonance structure for a BAW resonator including metallic Bragg mirror electrodes disposed on upper and lower surfaces of a piezoelectric film.
Figure 12B:
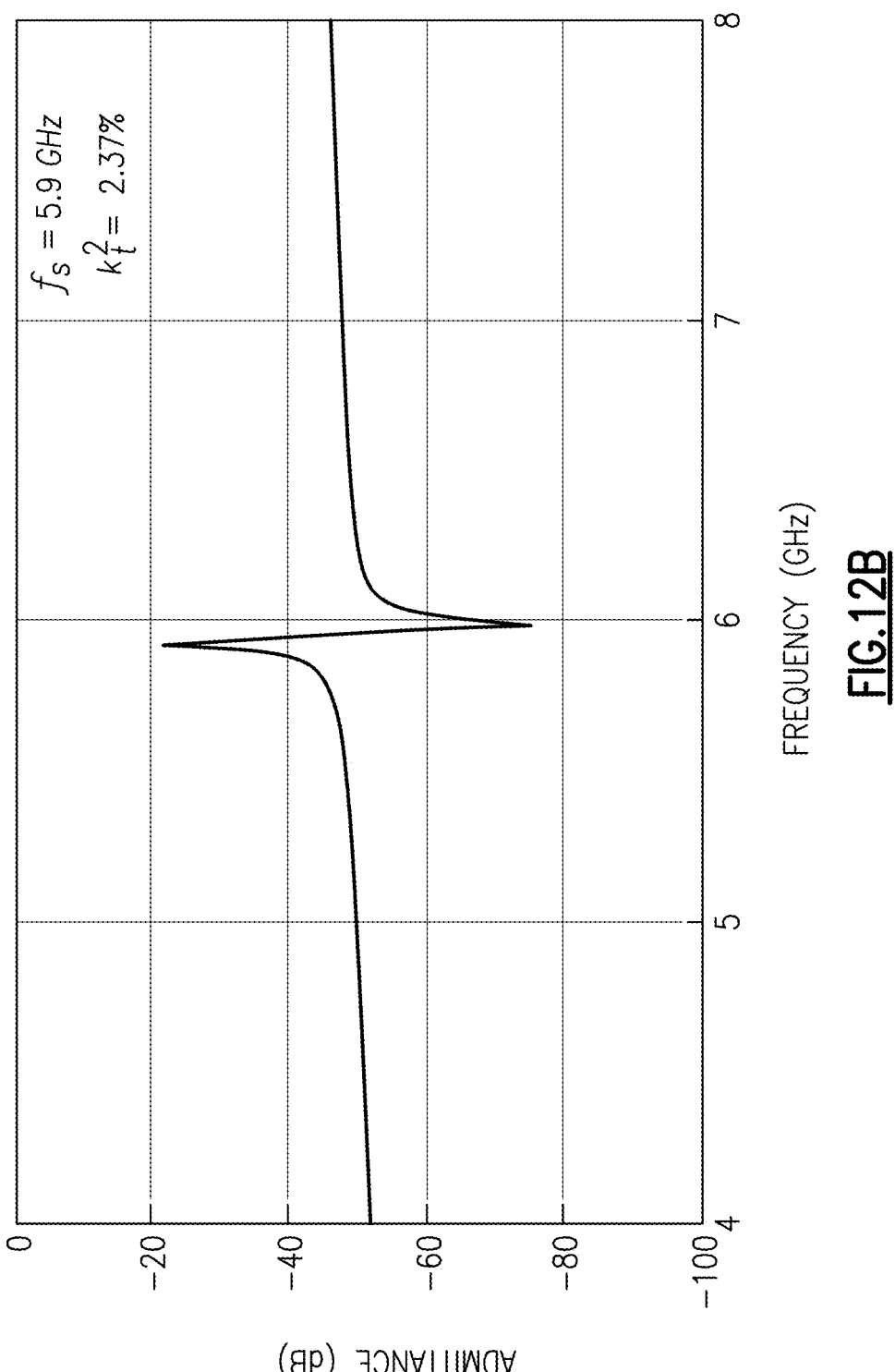
FIG. 12B illustrates a simulated admittance curve for a BAW resonator including the resonance structure of FIG. 12A.

One example of a piezoelectric material layer of a BAW resonator with Ru/Ti Bragg mirror electrode structures is illustrated in FIG. 12A. A simulated admittance curve of this structure is illustrated in FIG. 12B. As illustrated, the resonator structure including the piezoelectric material/ Bragg mirror layer stack exhibits a resonant frequency of 5.9 GHZ with an AlN layer thickness of 850 nm and four Ti and Ru layers for each of the top and bottom electrodes, each of the Ti and Ru layers having thicknesses of 275 nm. In comparison, the resonator stack illustrated in FIG. 6 has an AlN layer thickness of 525 nm, and that of FIG. 7 has an AlN layer thickness of 229 nm to achieve similar resonant frequencies as that of the structure of FIG. 12A.

Figure 13A:
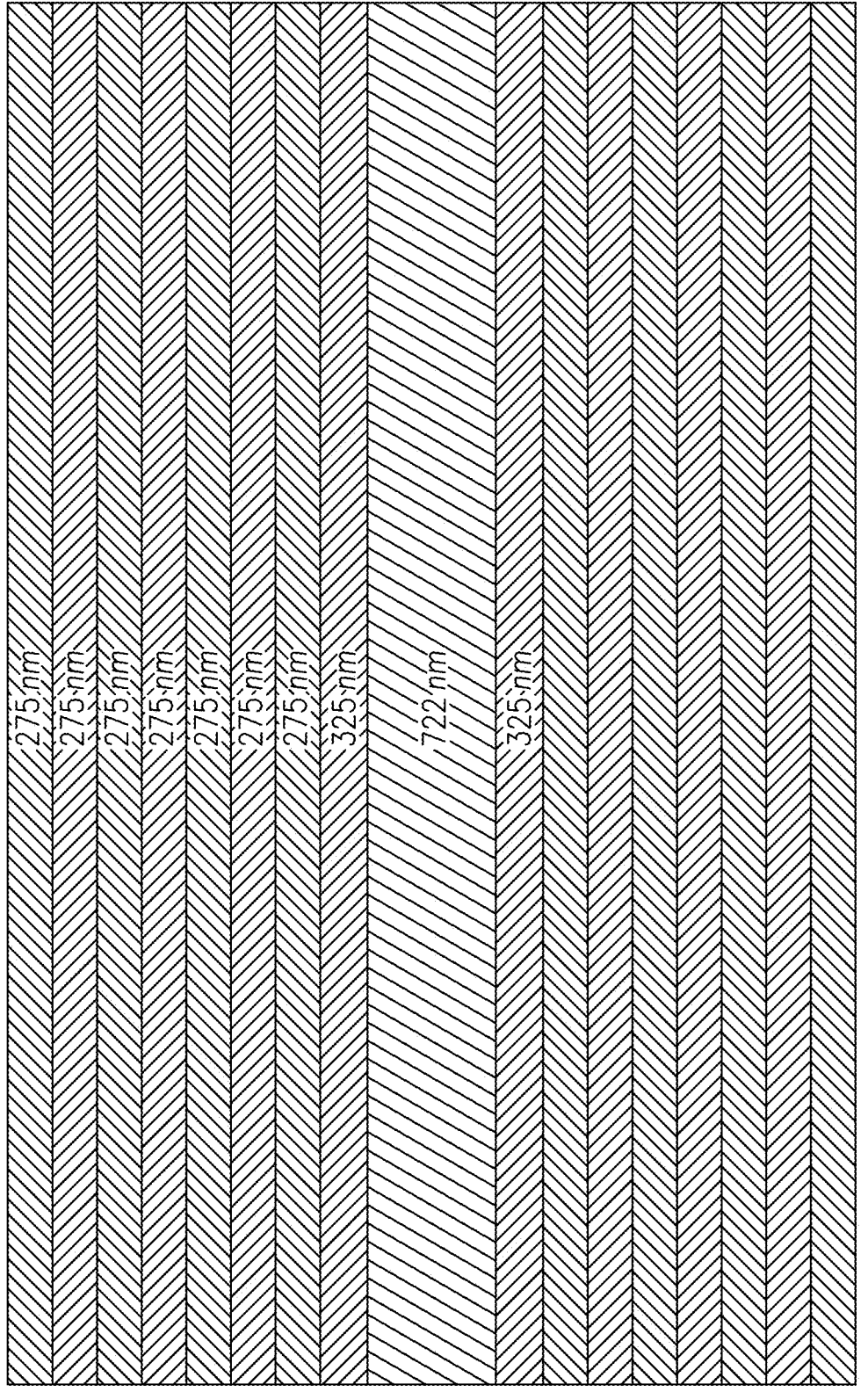
FIG. 13A illustrates a resonance structure for a BAW resonator including metallic Bragg mirror electrodes disposed on upper and lower surfaces of a piezoelectric film with the innermost metal layers having different thicknesses than the other metal layers.
Figure 13B:
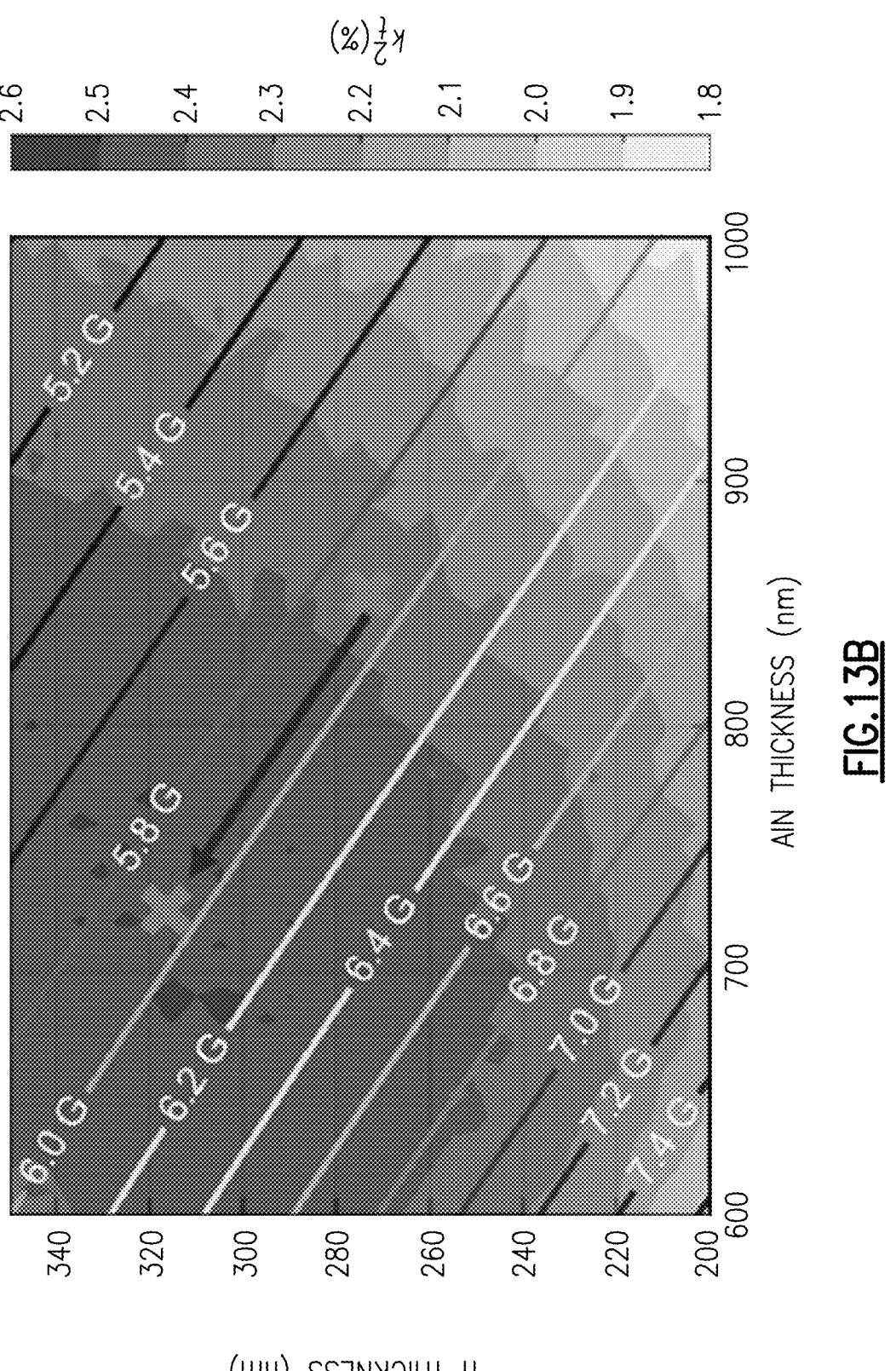
FIG. 13B is a chart of resonant frequency and electromechanical coupling coefficient as a function of piezoelectric material layer thickness and innermost electrode layer thicknesses in a BAW resonator including the resonance structure of FIG. 13A.

In some embodiments, the resonant frequency and electromechanical coupling coefficient of a BAW resonator stack such as illustrated in FIG. 12A may be adjusted by changing the thickness of the innermost Bragg mirror electrode layer—the innermost Ti layers in a structure such as that of FIG. 12A. FIG. 13A illustrates one example where the innermost Ti layers have thicknesses of 325 nm and all other metal layers have thicknesses of 275 nm. The effect of the change in thickness of the innermost metal layer is shown in the plot of FIG. 13B which shows resonant frequency and electromechanical coupling coefficient of a structure such as shown in FIG. 13A as a function of innermost Ti layer thickness and AlN layer thickness. As illustrated, as the innermost Ti layers increase in thickness the resonant frequency of the structure decreases while the electromechanical coupling coefficient increases. In contrast, both resonant frequency and electromechanical coupling coefficient decrease with increasing AlN layer thickness. Also as shown, one could achieve a resonant frequency of about 5.9 GHZ with an electromechanical coupling coefficient of about 2.35% with an AlN layer thickness of about 850 nm and innermost Ti layer thicknesses of 275 nm. One could increase the electromechanical coupling coefficient while maintaining the same resonant frequency by thinning the AlN layer to about 720 nm and increasing the innermost Ti layer thicknesses to about 315 nm.

Figure 14:
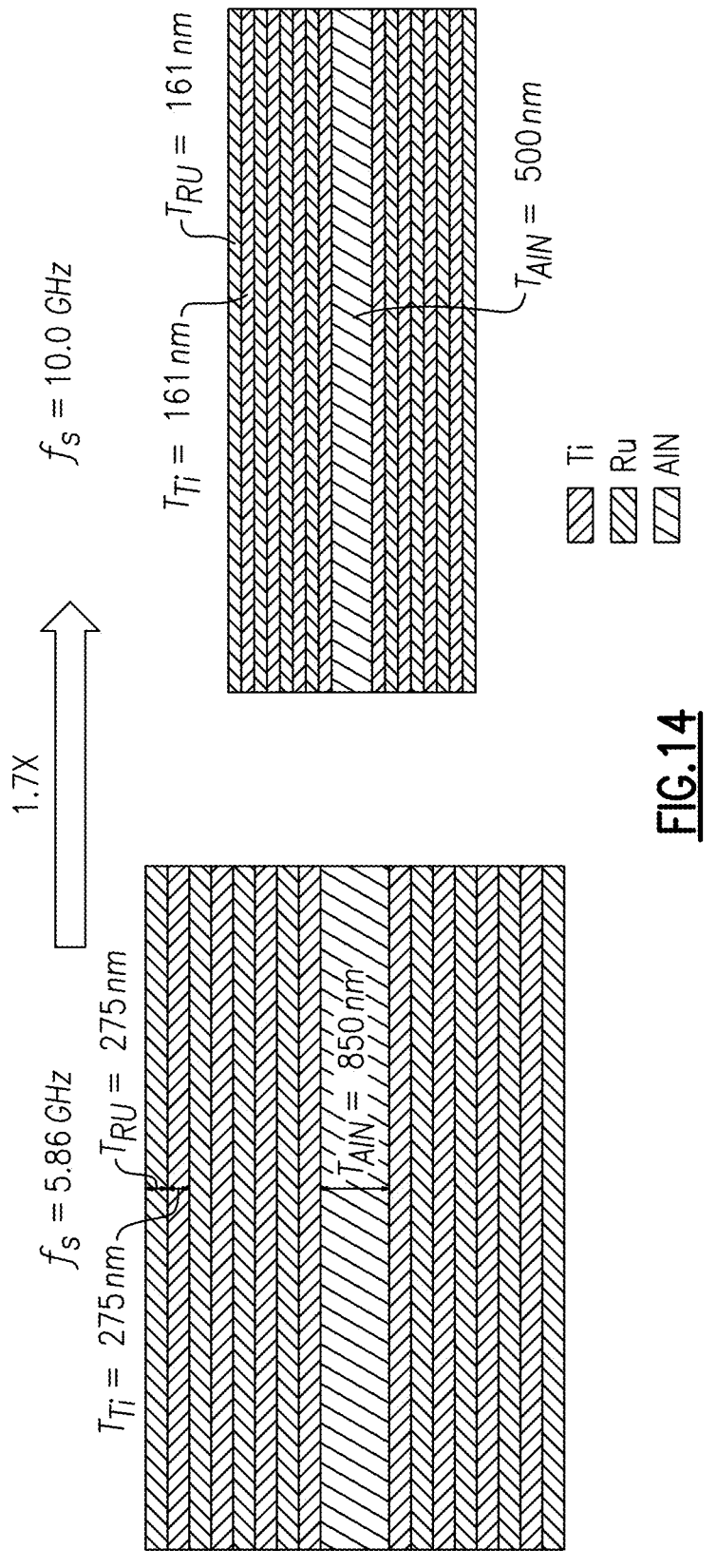
FIG. 14 illustrates how a resonance structure for a BAW resonator as illustrated in FIG. 12A may be thinned to increase its resonance frequency.

Scaling a resonator structure including Bragg reflector electrodes on a piezoelectric material layer as illustrated in FIG. 12A to achieve a higher resonance frequency, for example, to increase the resonance frequency from 5.86 GHz to 10 GHZ, may, as in the example shown in FIG. 8, involve a reduction in thickness of the material layer stack by about 1.7 times. Given that the AlN layer used in the 5.86 GHz embodiment has a thickness of 850 nm, the reduction in thickness to achieve a resonator with a 10 GHz resonant frequency would result in a resonator structure with an AlN layer about 500 nm thick, as illustrated in FIG. 14. The AlN layer is significantly thicker (500 nm vs. 134 nm) than that using the conventional electrode structure as illustrated in FIG. 8A and presents less of a challenge for repeatable manufacturing than the resonator structure using the conventional electrode configuration of FIG. 8A.

Utilizing metallic Bragg mirrors for the upper and lower electrodes of a piezoelectric film of a BAW resonator as disclosed herein thus provides for several advantages as compared to the use of conventional electrode structures. The Bragg mirror electrodes may be thicker and may have a lower electrical resistance than conventional electrodes and may be more effective at reflecting acoustic energy than conventional electrodes. The quality factor of a BAW resonator utilizing the metallic Bragg mirror electrodes as disclosed herein may thus be higher than a similar BAW resonator using conventional electrodes. The Bragg mirror electrodes provide for the piezoelectric film of a BAW resonator to be thicker for a given resonance frequency than conventional electrodes which may result in improved power handling and ruggedness. The thicker piezoelectric film may also exhibit an improved piezoelectric coefficient and loss tangent than thinner piezoelectric films that may be utilized in BAW resonators with conventional electrodes and similar resonance frequencies.

Figure 2:
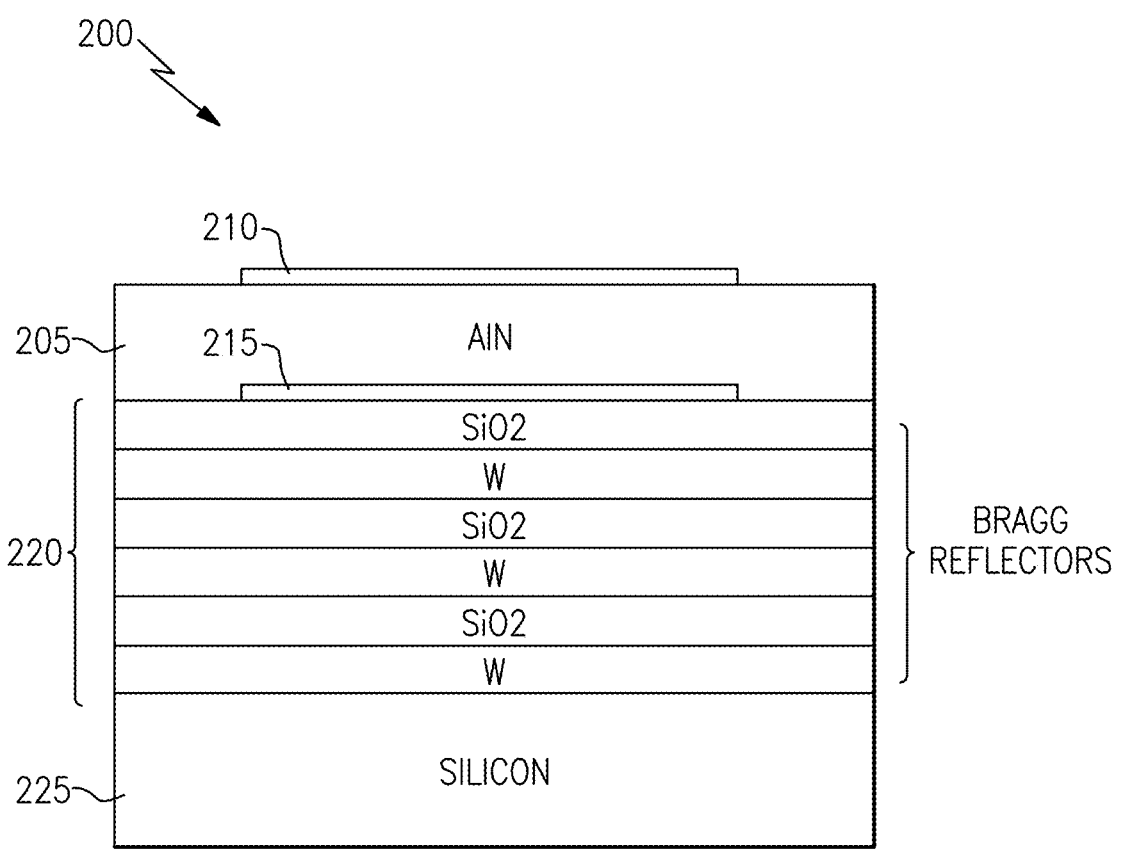
FIG. 2 is a cross-sectional view of an example of a solidly mounted resonator.
Figure 15:
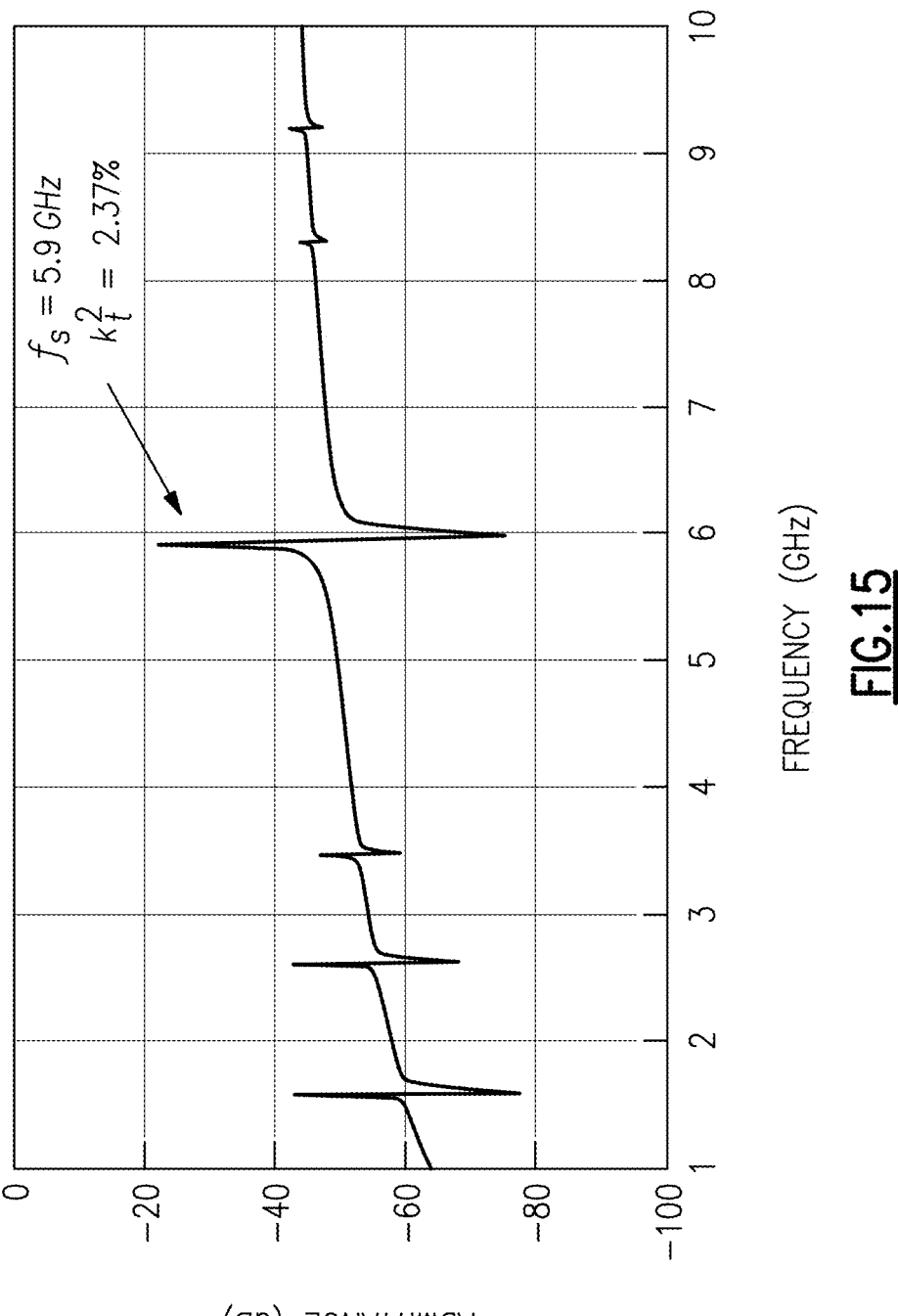
FIG. 15 illustrates a simulated admittance curve for a BAW resonator including metallic Bragg mirror electrodes as disclosed herein that includes spurious signals due to overmoding.
Figure 16A:
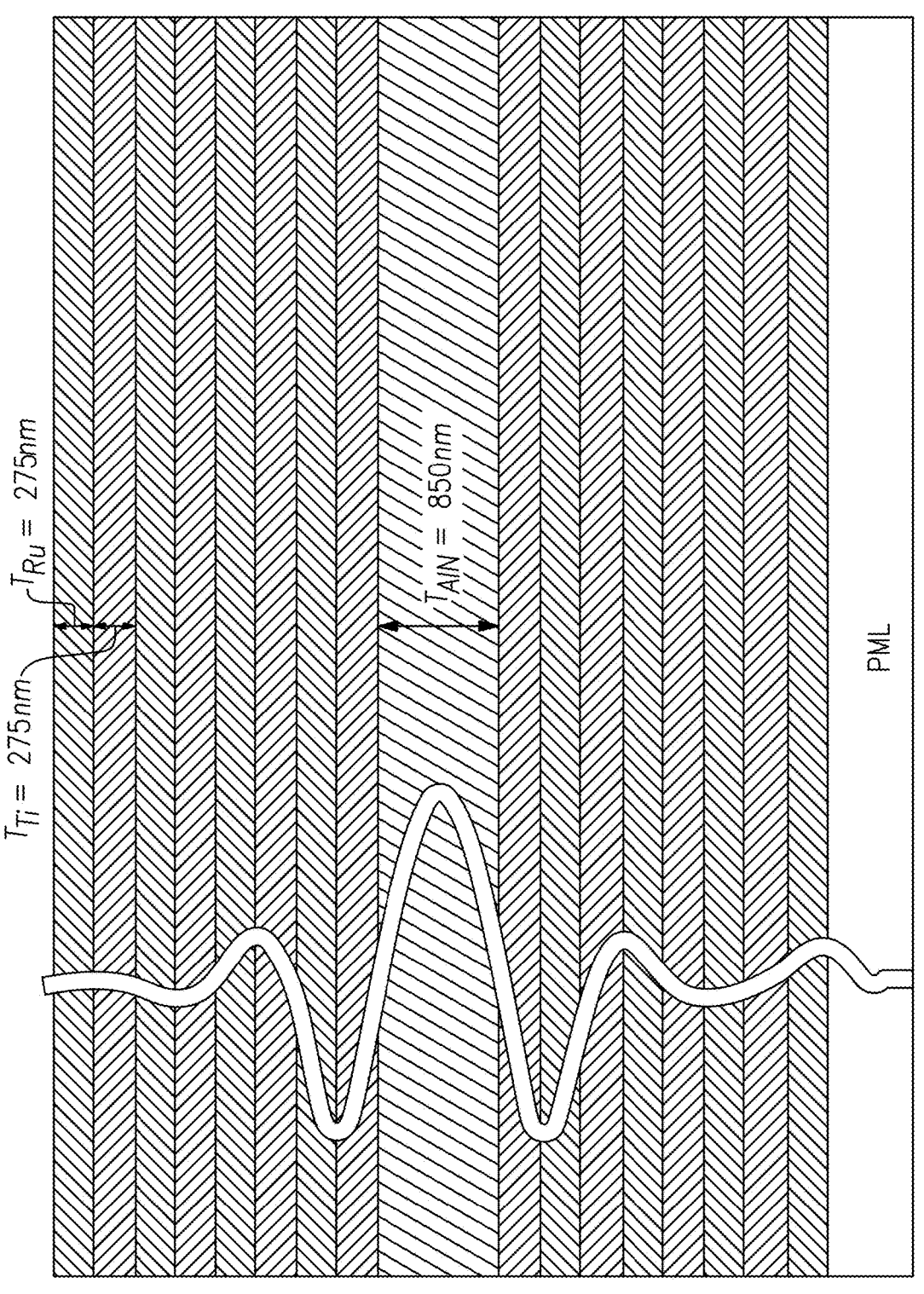
FIG. 16A illustrates how a resonance structure for a BAW resonator including a piezoelectric material layer with metallic Bragg mirror electrodes may be mounted on a substrate to reduce overmoding effects.
Figure 16B:
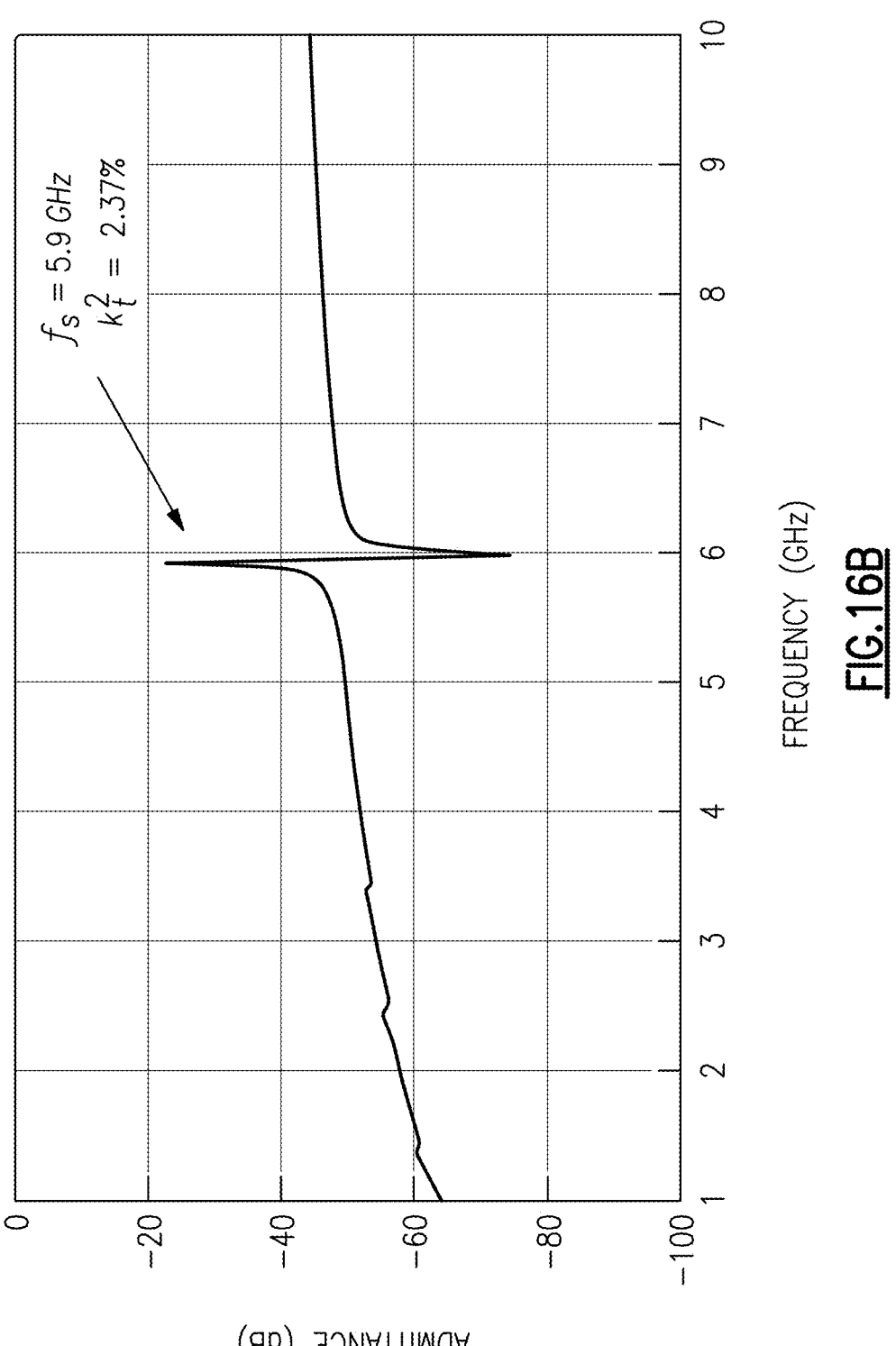
FIG. 16B is a simulated admittance curve of a BAW resonator having the resonance structure illustrated in FIG. 16A.

A disadvantage of utilizing metallic Bragg mirror electrodes as disclosed herein in BAW resonators as opposed to conventional electrodes is that overmoding, the excitation of higher and lower order vibrational modes as compared to the main acoustic wave, may be more pronounced. Overmoding may result in spurious signals in the admittance curve of a BAW resonator, for example, as illustrated in FIG. 15 and may degrade the electromechanical coupling coefficient due to energy used by the higher or lower order vibrational modes instead of the intended primary mode. Overmoding may be decreased by avoiding the use of a suspended resonating structure, for example, as illustrated in the film bulk acoustic wave resonator of FIG. 1, but instead by disposing the resonating structure on a substrate through which excess energy may dissipate, for example, in a SMR as shown in FIG. 2 (but with metallic Bragg reflector electrodes). FIG. 16A illustrates the resonator layer stack of a BAW resonator including the piezoelectric material layer and upper and lower metallic Bragg reflector electrodes disposed on a substrate (labelled "PML" for Perfect Matching Layer) and FIG. 16B illustrates the resultant decrease in spurious signals due to overmoding when compared to FIG. 15.

Figure 17A:
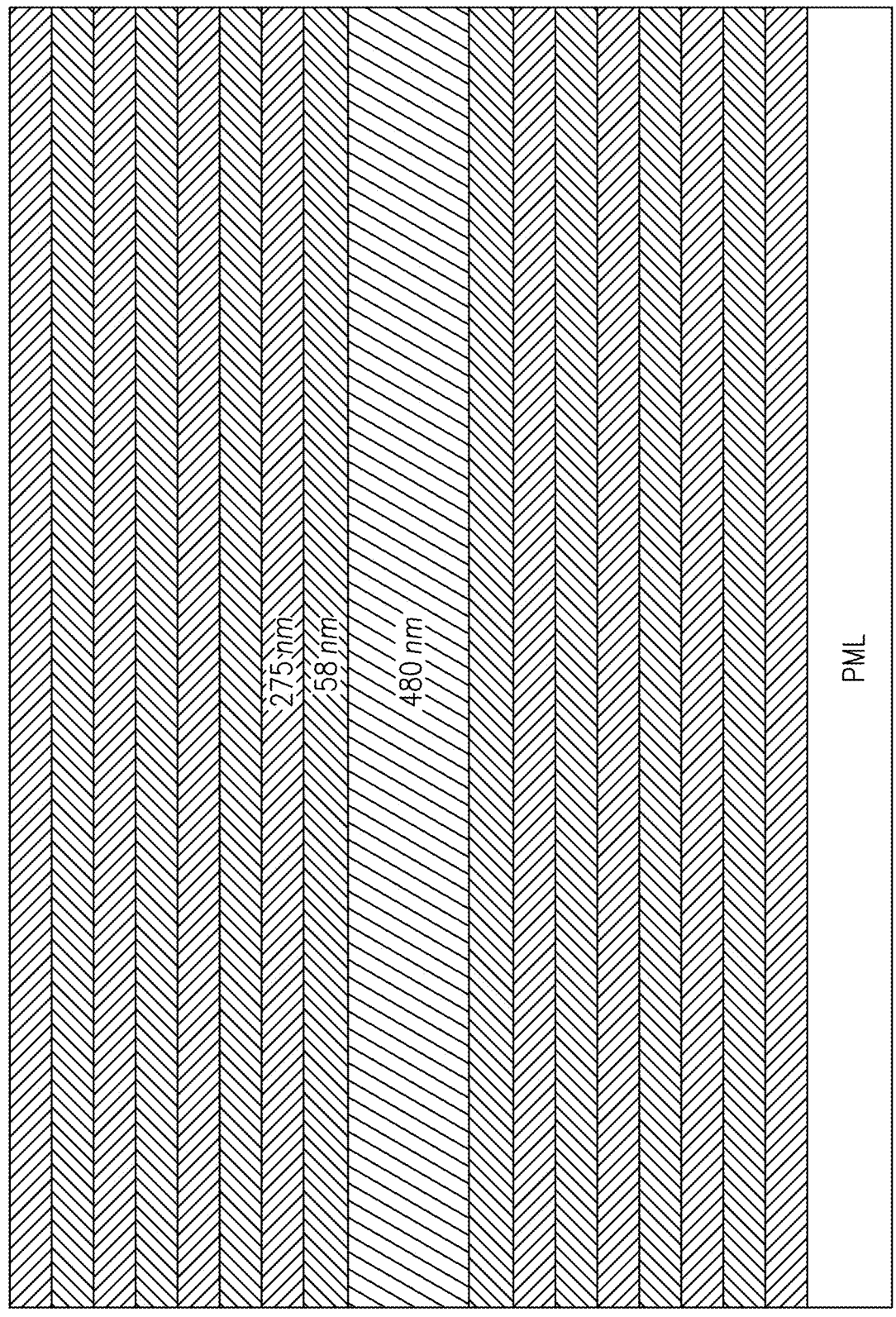
FIG. 17A illustrates another embodiment of a resonance structure for a BAW resonator including metallic Bragg mirror electrodes disposed on upper and lower surfaces of a piezoelectric film.
Figure 17B:
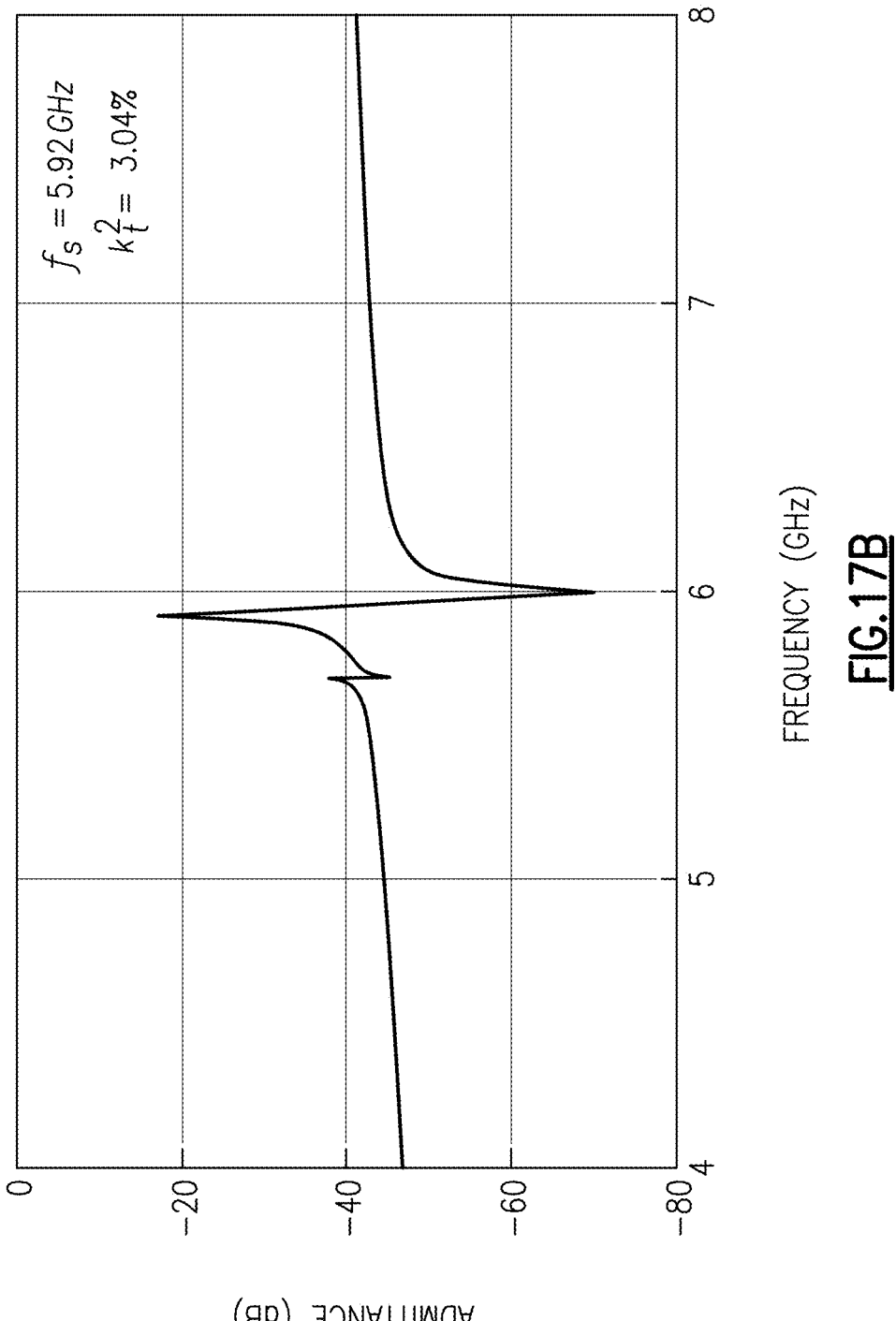
FIG. 17B illustrates a simulated admittance curve for a BAW resonator including the resonance structure of FIG. 17A.

In the embodiments above, metal layers of the metallic Bragg mirror electrodes with the lower acoustic impedance (the Ti) were disposed closest to (or disposed in contact with) the piezoelectric film. This need not be the case. In other embodiments, layers of the metal with the higher acoustic impedance, for example, Ru may be closest to (or disposed in contact with) the piezoelectric film. An example of this is shown in FIG. 17A. In FIG. 17A the innermost Ru layers have a reduced thickness of 58 nm to optimize the coupling coefficient of the resonator structure; all other metal layers except the innermost two Ru layers have thicknesses of 275 nm. The structure of FIG. 17A may result in a small spurious signal just below the resonance frequency of the resonator, as illustrated in the admittance curve of FIG. 17B.

Figure 18A:
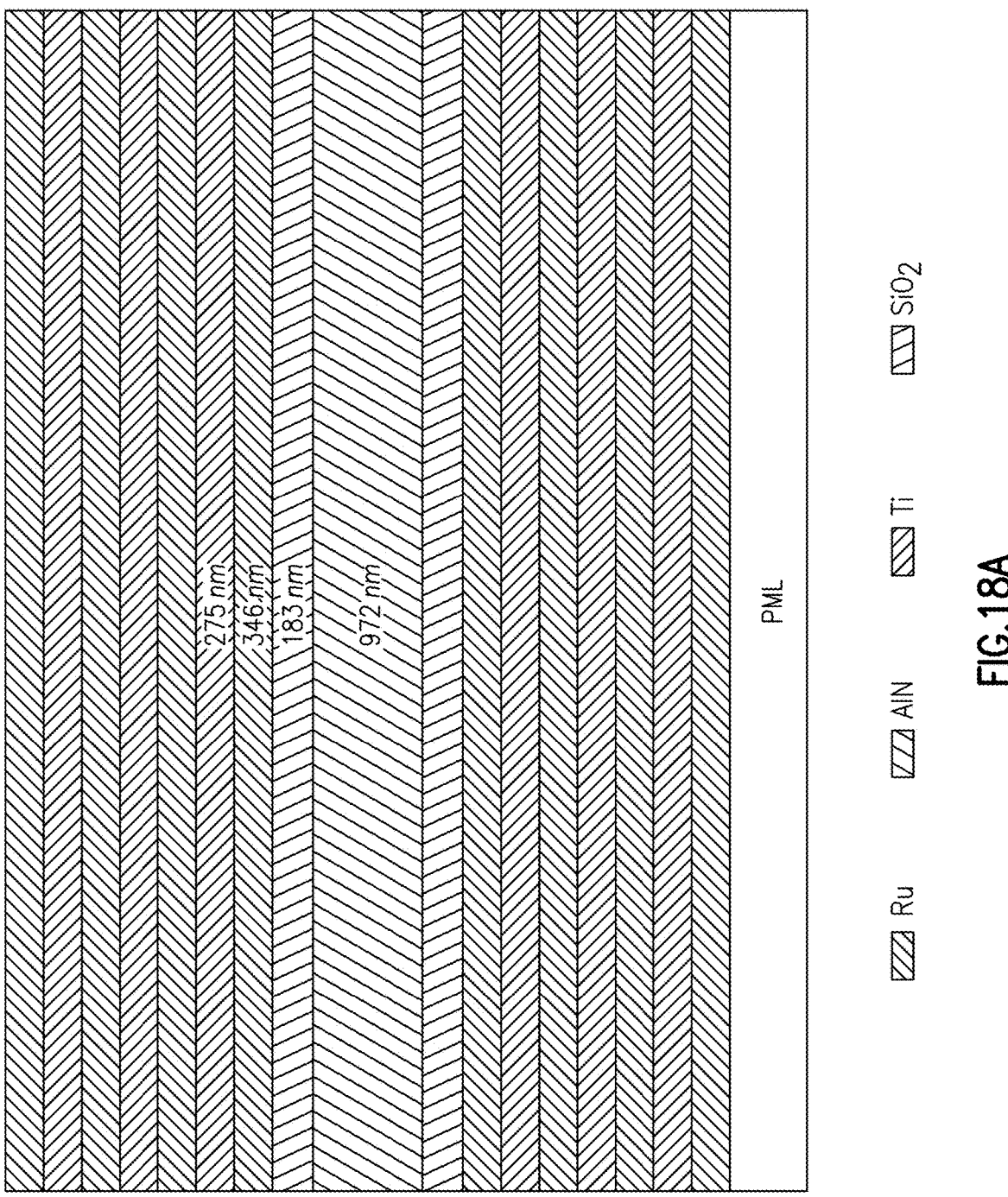
FIG. 18A illustrates another embodiment of a resonance structure for a BAW resonator including metallic Bragg mirror electrodes disposed on upper and lower surfaces of a piezoelectric film.
Figure 18B:
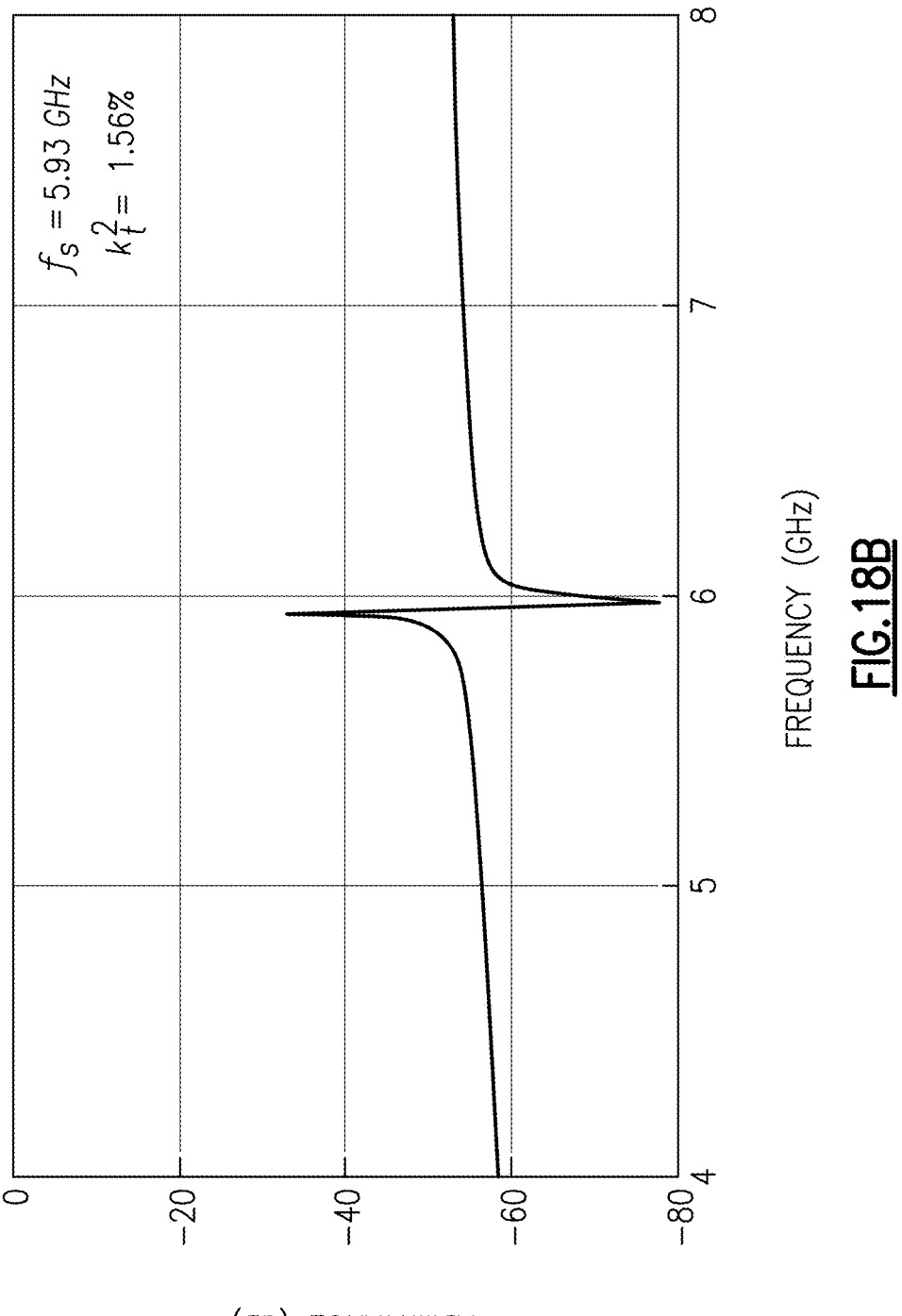
FIG. 18B illustrates a simulated admittance curve for a BAW resonator including the resonance structure of FIG. 18A.

In some embodiments, metal layers of the metallic Bragg mirror electrodes need not directly contact the piezoelectric material layer. An additional material layer, for example, a $SiO_2$ temperature compensation layer may be disposed between the upper and lower metallic Bragg mirror electrodes and the piezoelectric material layer as illustrated in FIG. 18A. FIG. 18B illustrates a simulated admittance curve for a BAW resonator including the resonator stack structure of FIG. 18A.

Figure 19A:
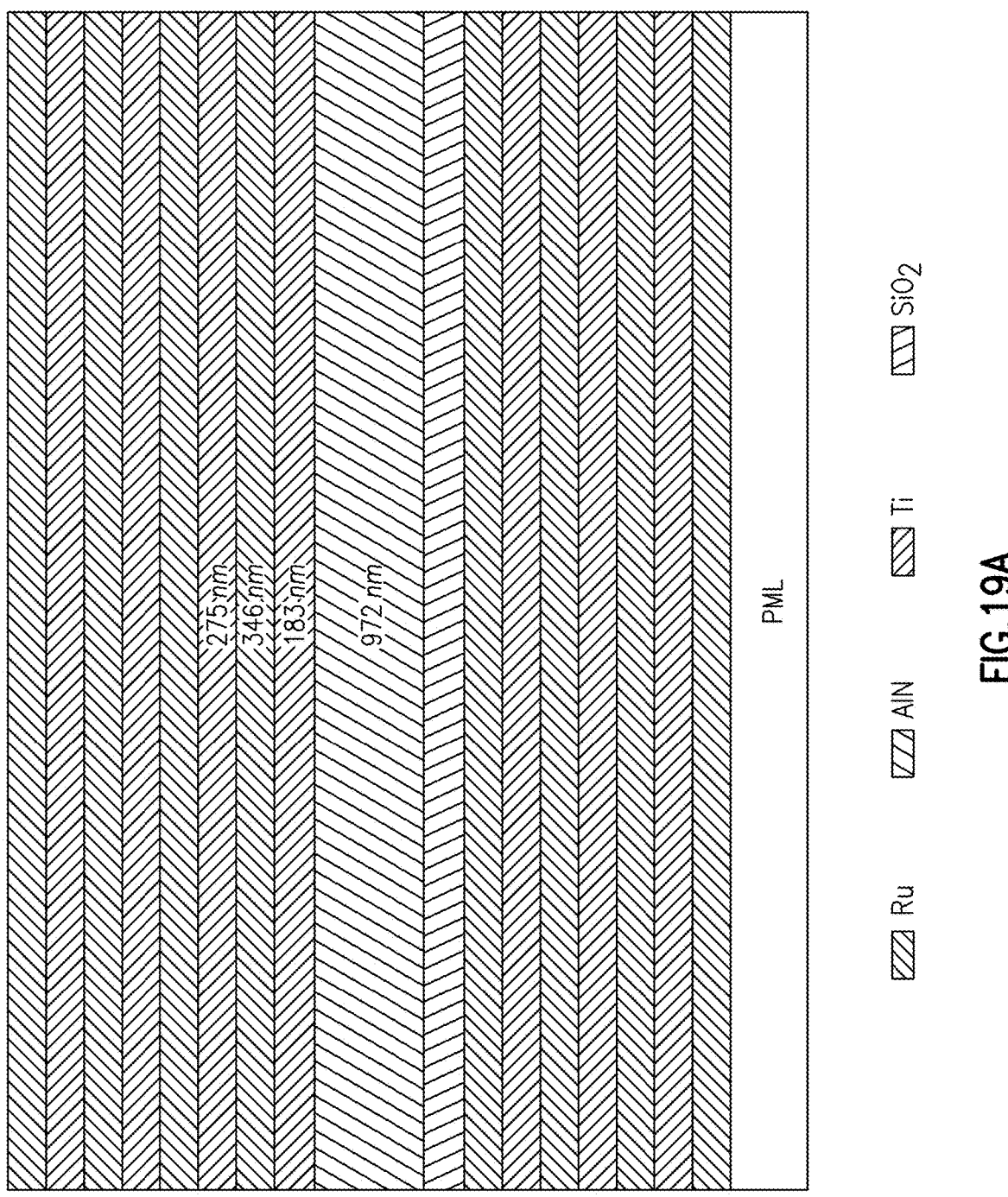
FIG. 19A illustrates another embodiment of a resonance structure for a BAW resonator including metallic Bragg mirror electrodes disposed on upper and lower surfaces of a piezoelectric film.
Figure 19B:
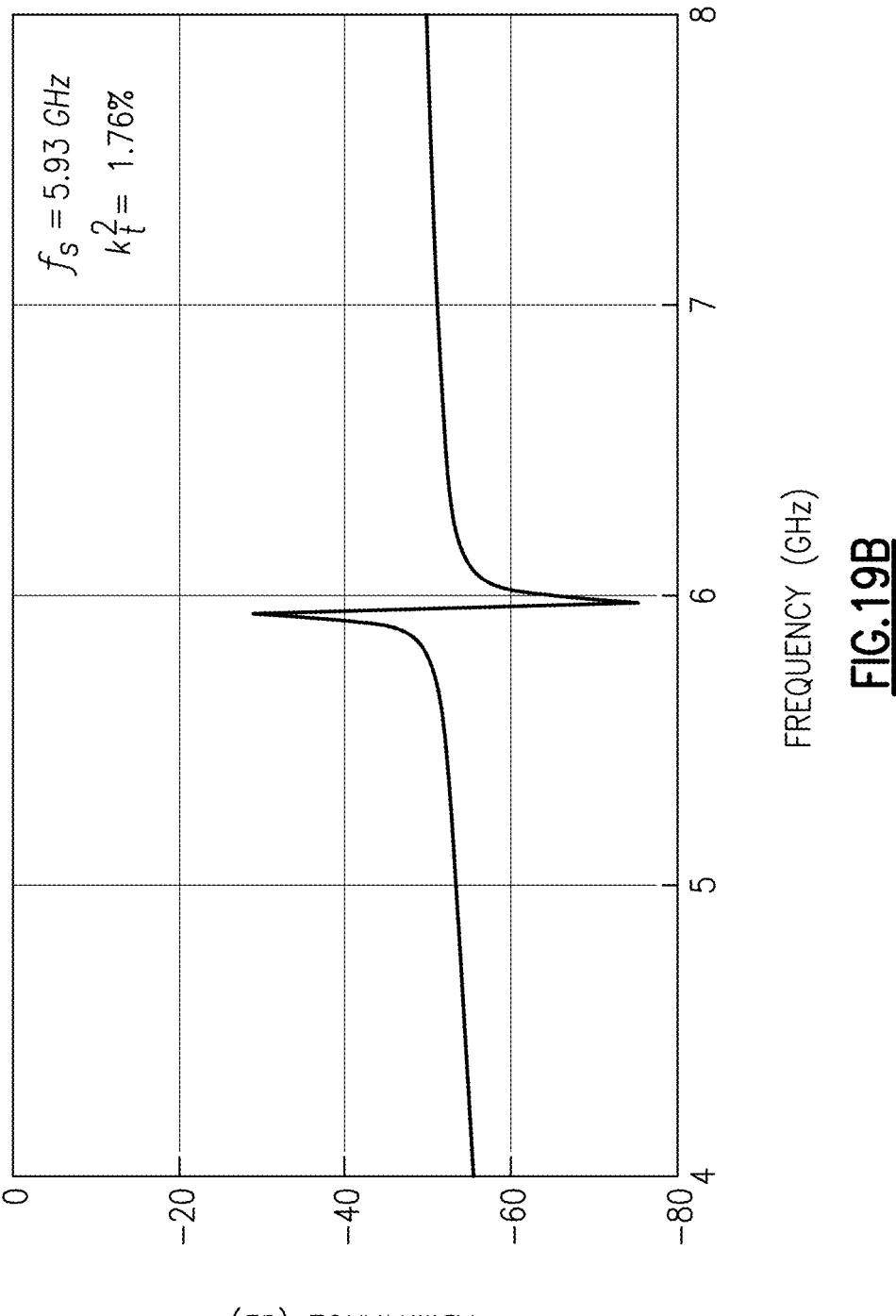
FIG. 19B illustrates a simulated admittance curve for a BAW resonator including the resonance structure of FIG. 19A.

In other embodiments, the temperature compensation layer may be disposed on a single side of the piezoelectric material layer. Further, metal layers formed of different metals may be closest to the piezoelectric material layer. In the metal stack of the Bragg reflector electrodes, the innermost metal layer(s) may have different thicknesses than the other metal layers and metal layers of one metal may be thinner or thicker than metal layers of the other metal. FIG. 19A shows an example of this where a layer of $SiO_2$ is disposed on the bottom of the AlN layer followed by a layer of Ru. An innermost Ti layer of the upper electrode on the upper surface of the AlN layer has a thickness of 183 nm. The remaining Ti layers have thicknesses of 275 nm and the Ru layers have thicknesses of 346 nm. FIG. 19B illustrates a simulated admittance curve of a BAW resonator having the resonator structure of FIG. 19A. In some embodiments, the thickness of the metal layers may be determined by the wavelength $\lambda$ of the acoustic wave having the resonant frequency of the BAW resonator and the acoustic velocity through the different metal layers so each metal layer has a thickness of $\lambda/4$.

Figure 20:
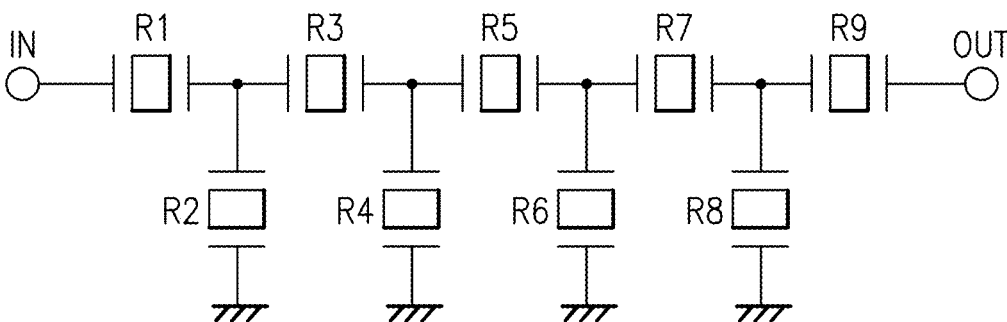
FIG. 20 illustrates an example of a radio frequency filter.

In some embodiments, multiple BAW resonators as disclosed herein may be combined into a filter, for example, an RF ladder filter schematically illustrated in FIG. 20 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include BAW devices or resonators, for example, duplexers, baluns, etc., may also be formed including examples of BAW resonators as disclosed herein.

Figure 21:
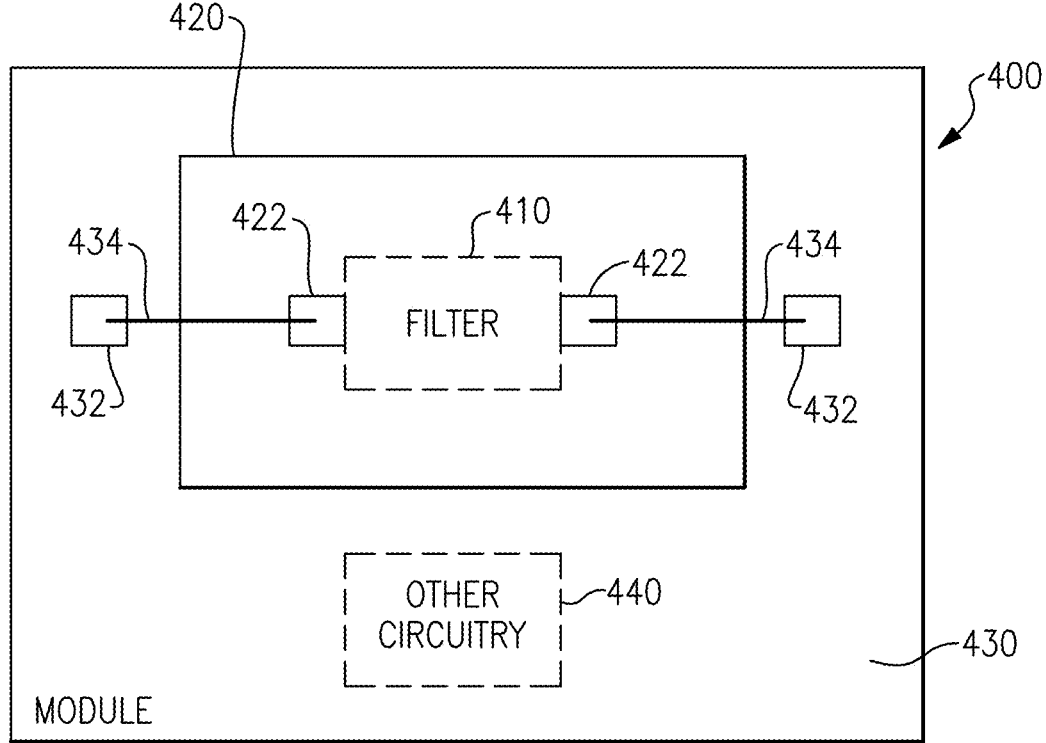
FIG. 21 illustrates an embodiment of an electronics module.
Figure 22:
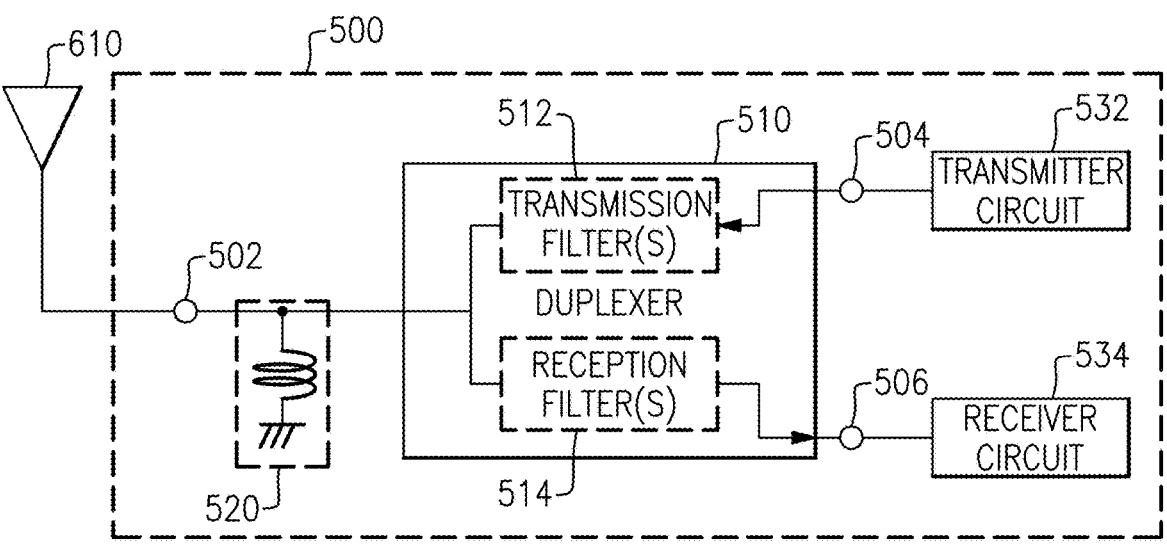
FIG. 22 illustrates an example of a front-end module which may be used in an electronic device.
Figure 23:
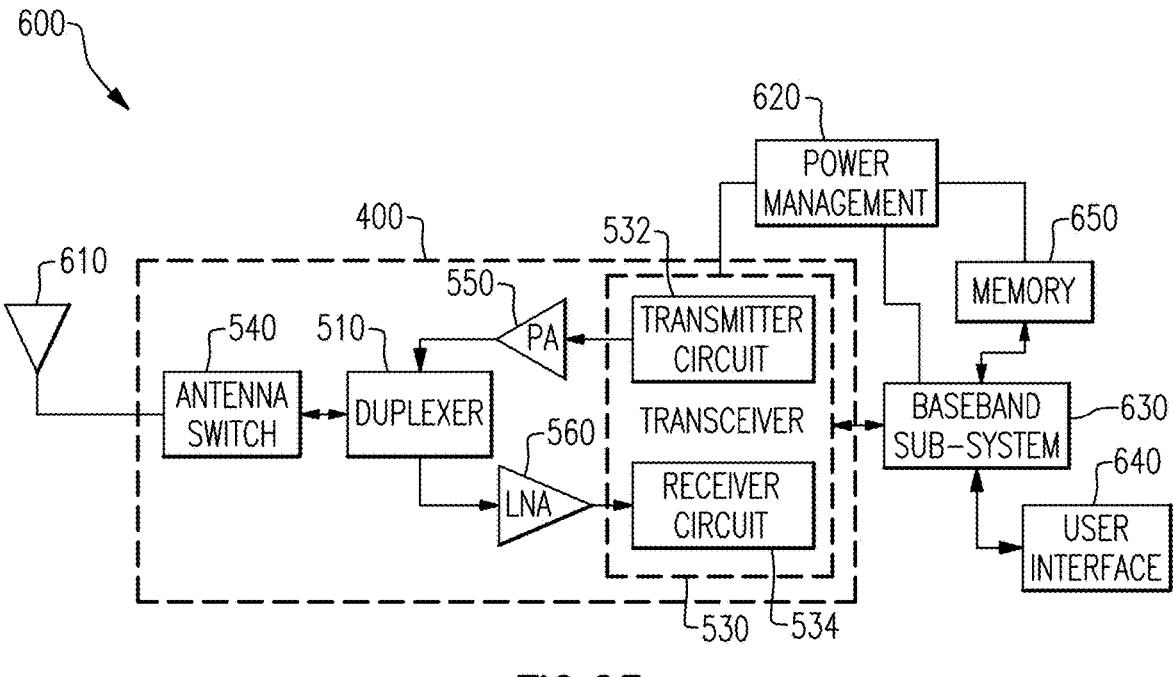
FIG. 23 illustrates an example of an electronic device.

The acoustic wave devices discussed herein can be implemented in a variety of packaged modules. Some example packaged modules will now be discussed in which any suitable principles and advantages of the packaged acoustic wave devices discussed herein can be implemented. FIGS. 21, 22, and 23 are schematic block diagrams of illustrative packaged modules and devices according to certain embodiments.

As discussed above, embodiments of the disclosed BAW resonators can be configured as or used in filters, for example. In turn, a BAW filter using one or more BAW elements may be incorporated into and packaged as a module that may ultimately be used in an electronic device, such as a wireless communications device, for example.

FIG. 21 is a block diagram illustrating one example of a module 400 including a BAW filter 410. The BAW filter 410 may be implemented on one or more die(s) 420 including one or more connection pads 422. For example, the BAW filter 410 may include a connection pad 422 that corresponds to an input contact for the BAW filter and another connection pad 422 that corresponds to an output contact for the BAW filter. The packaged module 400 includes a packaging substrate 430 that is configured to receive a plurality of components, including the die 420. A plurality of connection pads 432 can be disposed on the packaging substrate 430, and the various connection pads 422 of the BAW filter die 420 can be connected to the connection pads 432 on the packaging substrate 430 via electrical connectors 434, which can be solder bumps or wirebonds, for example, to allow for passing of various signals to and from the BAW filter 410. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the BAW filter 410 can be used in a wide variety of electronic devices. For example, the BAW filter 410 can be used in an antenna duplexer, which itself can be incorporated into a variety of electronic devices, such as RF front-end modules and communication devices.

Referring to FIG. 22, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the BAW filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 22, however, in other embodiments these components may be integrated into a common transceiver circuit or module. As will be appreciated by those skilled in the art, the front-end module 500 may include other components that are not illustrated in FIG. 22 including, but not limited to, switches, electromagnetic couplers, amplifiers, processors, and the like.

FIG. 23 is a block diagram of one example of a wireless device 600 including the antenna duplexer 510 shown in FIG. 22. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 22. The front-end module 500 includes the duplexer 510, as discussed above. In the example shown in FIG. 23 the front-end module 500 further includes an antenna switch 540, which can be configured to switch between different frequency bands or modes, such as transmit and receive modes, for example. In the example illustrated in FIG. 23, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 22.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 23, the front-end module 500 may further include a low noise amplifier module 560, which amplifies received signals from the antenna 610 and provides the amplified signals to the receiver circuit 534 of the transceiver 530.

The wireless device 600 of FIG. 23 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHZ.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave resonator comprising:
a layer of piezoelectric material;
an upper electrode disposed on top of the layer of piezoelectric material, the upper electrode including a metallic Bragg mirror having multiple pairs of alternating layers of a first metal and a second metal, a metal layer of the upper electrode closest to the layer of piezoelectric material having a different thickness than other layers of that same metal; and
a lower electrode disposed on a bottom of the layer of piezoelectric material, the lower electrode including a metallic Bragg mirror having alternating layers of a third metal and a fourth metal.

2. The bulk acoustic wave resonator of claim 1 wherein the first metal is the same as the third metal and the second metal is the same as the fourth metal.

3. The bulk acoustic wave resonator of claim 1 wherein the first metal has a different acoustic impedance than an acoustic impedance of the second metal and a different electrical conductivity than an electrical conductivity of the second metal.

4. The bulk acoustic wave resonator of claim 3 wherein the first metal is titanium and the second metal is ruthenium.

5. The bulk acoustic wave resonator of claim 1 wherein each of the layers of the first and second metals has a same thickness.

6. The bulk acoustic wave resonator of claim 5 wherein each of the layers of the first and second metals has a thickness of $\lambda/4$, $\lambda$ being a wavelength of a main acoustic wave generated in the bulk acoustic wave resonator.

7. The bulk acoustic wave resonator of claim 1 wherein a metal layer of the lower electrode closest to the layer of piezoelectric material has a different thickness than other layers of that same metal.

8. The bulk acoustic wave resonator of claim 1 wherein the metal layer of the upper electrode closest to the layer of piezoelectric material is formed of the first metal and has a lower acoustic impedance than the second metal.

9. The bulk acoustic wave resonator of claim 1 wherein the metal layer of the upper electrode closest to the layer of piezoelectric material is formed of the first metal and has a higher acoustic impedance than the second metal.

10. The bulk acoustic wave resonator of claim 1 configured as a film bulk acoustic wave resonator.

11. The bulk acoustic wave resonator of claim 1 configured as a solidly mounted resonator.

12. The bulk acoustic wave resonator of claim 1 further comprising a layer of dielectric material disposed between the layer of piezoelectric material and at least one of the upper electrode or the lower electrode.

13. The bulk acoustic wave resonator of claim 1 wherein a metal layer of the upper electrode closest to the layer of piezoelectric material is formed of a same metal as a metal layer of the lower electrode closest to the layer of piezoelectric material.

14. The bulk acoustic wave resonator of claim 1 wherein a metal layer of the upper electrode closest to the layer of piezoelectric material is formed of a different metal than a metal layer of the lower electrode closest to the layer of piezoelectric material.

15. The bulk acoustic wave resonator of claim 1 wherein the layers of the first metal have different thicknesses than the layers of the second metal.

16. An acoustic wave filter including the bulk acoustic wave resonator of claim 1.

17. An electronics module including the acoustic wave filter of claim 16.

18. An electronic device including the electronics module of claim 17.

19. A bulk acoustic wave resonator comprising:
a single layer of piezoelectric material;
an upper electrode disposed on top of the single layer of piezoelectric material, the upper electrode including a metallic Bragg mirror having alternating layers of a first metal and a second metal, a metal layer of the upper electrode closest to the layer of piezoelectric material having a different thickness than other layers of that same metal;
a lower electrode disposed on a bottom of the single layer of piezoelectric material, the lower electrode including a metallic Bragg mirror having alternating layers of a third metal and a fourth metal; and
a layer dielectric material disposed between the single layer of piezoelectric material and at least one of the upper electrode of the lower electrode.

20. A bulk acoustic wave resonator comprising:
a layer of piezoelectric material;
an upper electrode disposed on top of the layer of piezoelectric material, the upper electrode including a metallic Bragg mirror having alternating layers of a first metal and a second metal, a plurality of the layers of the first and second metals having a thickness of $\lambda/4$, $\lambda$ being a wavelength of a main acoustic wave generated in the bulk acoustic wave resonator, a metal layer of the upper electrode closest to the layer of piezoelectric material having a different thickness than other layers of that same metal; and
a lower electrode disposed on a bottom of the layer of piezoelectric material, the lower electrode including a metallic Bragg mirror having alternating layers of a third metal and a fourth metal.

* * * * *